(12) United States Patent
Schoenauer et al.

(10) Patent No.: US 7,400,526 B2
(45) Date of Patent: Jul. 15, 2008

(54) MEMORY ELEMENT, MEMORY READ-OUT ELEMENT AND MEMORY CELL

(75) Inventors: Tim Schoenauer, Feldkirchen (DE); Michael Kund, Tuntenhausen (DE); Thomas Niedermeier, Rosenheim (DE); Joerg Berthold, Munich (DE)

(73) Assignee: Infineon Technologies AG, Munich (DE)

( * ) Notice: Subject to any disclaimer, the term of this patent is extended or adjusted under 35 U.S.C. 154(b) by 175 days.

(21) Appl. No.: 11/427,337

(22) Filed: Jun. 28, 2006

(65) Prior Publication Data
US 2007/0002618 A1    Jan. 4, 2007

(30) Foreign Application Priority Data
Jun. 28, 2005  (DE)  ........................ 10 2005 030 143

(51) Int. Cl.
*G11C 11/00*    (2006.01)
(52) U.S. Cl. .................... 365/163; 365/154; 365/185.08
(58) Field of Classification Search ................. 365/163, 365/154, 185.08
See application file for complete search history.

(56) References Cited

U.S. PATENT DOCUMENTS

| | | | |
|---|---|---|---|
| 5,787,042 A * | 7/1998 | Morgan | ....................... 365/196 |
| 5,986,925 A | 11/1999 | Naji et al. | |
| 6,956,774 B2 * | 10/2005 | Lung et al. | ............. 365/185.28 |
| 2004/0125643 A1 | 7/2004 | Kang et al. | |
| 2004/0141363 A1 | 7/2004 | Ohtsuka et al. | |
| 2005/0117397 A1 | 6/2005 | Morimoto | |

OTHER PUBLICATIONS

Agostino Pirovano, et al., Low-Field Amorphous State Resistance and Threshold Voltage Drift in Chalcogenide Materials, IEEE Transactions on Electronic Devices, vol. 51, No. 5, May 2004, pp. 714-719.
A. Redaelli, et al., Electronic Switching Effect and Phase-Change Transition in Chalcogenide Materials, IEEE Electron Device Letters, vol. 25, No. 10, Oct. 2004, pp. 684-686.

* cited by examiner

*Primary Examiner*—Pho M. Luu
(74) *Attorney, Agent, or Firm*—Dicke, Billig, Czaja PLLC

(57) ABSTRACT

A memory element comprises a resistance element having a first resistance value in a first state and a second resistance value in a second state, it being possible to convert the resistance element from the first state into the second state and from the second state into the first state and the first resistance value and the second resistance value being different, a current generating device, coupled to a first terminal of the resistance element, the current generating device being designed to generate a current with a first amplitude through the resistance element when a predetermined potential is present at a second terminal of the resistance element, in order to convert the resistance element into the first state for setting the first resistance value, or to generate a current with a second amplitude through the resistance element when the predetermined potential is present at the second terminal of the resistance element, in order to convert the resistance element into the second state for setting the second resistance value, the first resistance value representing a first memory state and the second resistance value representing a second memory state.

33 Claims, 13 Drawing Sheets

MEMORY ELEMENT, MEMORY READ-OUT ELEMENT AND MEMORY CELL

CROSS-REFERENCE TO RELATED APPLICATIONS

This application claims foreign priority benefits under 35 U.S.C. §119 to co-pending German patent application number 10 2005 030 143.6, filed Jun. 28, 2005. This related patent application is herein incorporated by reference in its entirety.

BACKGROUND OF THE INVENTION

1. Field of the Invention

Embodiments of the invention relate to non-volatile storage using resistance elements, in particular, using phase change memory elements (PCM).

2. Description of the Related Art

Memory cells may be used in all applications which use data storage. Typical semiconductor circuits comprise data memory cells which are either formed between logic elements, such as, e.g., latch registers, or which are formed as block memories, such as SRAM (static random access memory), for example. A block memory typically comprises an array of memory cells, only a few cells being subjected to a write operation or a read-out operation simultaneously. Therefore, the columns of a block memory array may have common area-consuming elements, such as, e.g., sense amplifiers, which support the storage or read-out operation. On the other hand, in the case of distributed data memory cells, which are, e.g., part of a logic circuit, these cells may permanently supply the stored information if the cell is continuously read.

There are a multiplicity of implementations of volatile memory cells, in the case of which the stored information is lost when the supply power is turned off, and of non-volatile memory cells. FIGS. 9a to 9c illustrate some memory cells known from the prior art, FIG. 9a showing a 6T-SRAM cell, FIG. 9b showing a flash cell, and FIG. 9c showing a latch cell.

What may be disadvantageous about the SRAM cells and the latch cells may be that they are volatile and have a considerable area usage. Flash technology may use a second, high supply voltage (12 V-18 V), the generation of which may use voltage pumps which take up area and cause, e.g., crosstalk. Flash technology is furthermore distinguished by an only limited scaling potential and permits only a limited number of write cycles.

Modern memory technologies typically comprise large memory modules based on resistance elements, such as, e.g., ferroelectric random access memories (RAMs), magnetoresistive RAMs, or phase change RAMs. However, these architectures are usually aimed at the array-based block memories mentioned above, only a few cells being read simultaneously.

A promising technology for memory circuits is the phase change memory (PCM) technology already mentioned, the characteristic of which comes close to the characteristic of preprogrammable resistance elements R1 and R2. The fundamental principle of PCM elements is based on a thermally engendered reversible phase change between an amorphous phase and a crystalline (e.g. polycrystalline) phase of a chalcogenide glass.

The amorphous state produces a high resistance, whereas the polycrystalline state produces a low resistance. The phase change is engendered by heat which arises on account of a current flow through the resistance element. The duration and the intensity of the current determine whether the element subsequently has a high or a low resistance value. Phase change technology is currently the subject of intensive research with regard to its use in particular in block memories. Typical values for phase change elements are a reset current (on to off) of 200 µA over 10 ns and a subsequent resistance value Roff in the region of 1 MΩ, and a set current (off to on) of approximately 50 µA with a duration of 50 ns, which results in a subsequent resistance value Ron in the region of 10 kΩ.

Non-volatile memory cells which use programmable resistance elements are known from the prior art. US 2004/0125643 A1 discloses a non-volatile memory cell illustrated in FIG. 10. The circuit comprises a write/read controller (20), two programmable resistance elements (R1 and R2) and also a switch (SW2). The resistance elements are programmed on the basis of PCM technology. During the write operation, as a result of a choice of the suitable polarities of the control signals WRC1, WRC2 and WRC3, a current is constrained through the resistance elements R1 and/or R2, as a result of which they are programmed. During the read-out operation, as a result of an application of a low WRC2 (WRC2=low) and a high WRC3 (WRC3=high), a transmission gate (20) is converted into a non-conducting state, so that a voltage level is established at the node F, in a manner dependent on the states of the resistance elements and the nodes D and E, which voltage level controls the switch SW2.

What may be disadvantageous about the above concept may be inflexibility in the write operation. PCM elements are typically programmed into the high-resistance state using a current having a high amplitude for a short time duration and into the low-resistance state using a lower current for a longer time duration. For this purpose, different voltages have to be generated across R1 and R2, so that the amplitudes of the currents through the resistance elements are generated by a difference between the voltages across the resistance elements. Consequently, the amplitudes of the currents depend on one another, so that it is not possible for them to be set precisely and individually. Furthermore, different voltages have to be generated across the resistance elements, which is associated with a high outlay. High losses (leakage) furthermore arise because the PCM elements attain a resistance value in the region of 1 MΩ in the high-resistance state. If a voltage of approximately 1 V were applied between the nodes D and E, then a cross current of approximately 1 µA would flow. Such a current loss (leakage current) may be unacceptable for some applications. A further possible disadvantage of the above concept may be that there is a risk of a destructive read-out during the read-out of the memory cells. A current which flows through R1 and R2 for the purpose of reading out the stored information might erase the stored information in the case of an imprecise setting.

US 2004/0141363 A1 discloses a non-volatile flip-flop. The basic circuit is illustrated in FIG. 11a. This involves a conventional SRAM cell that has been extended by a pass transistor (9, 10) and by a resistance element (11, 12), which connects a metallization (plate line, PL) to each of the inverters (5, 6). The bit lines (BL1, BL2) are connected to the cross-coupled inverters via transistors (7, 8). A timing diagram illustrated in FIG. 11b shows an example of a write operation in which the two resistance elements are initially reset by means of a suitable pulse sequence of the signals "CL" and "PL". Afterwards, one of the two resistance elements is set into a state having a low resistance by means of a short pulse on the common control signal line (CL). Which of the two elements is converted (set) into the low-resistance state depends on the state of the nodes 5 and 6. As illustrated in FIG. 11b, the reset operation or the set operation may differ either in terms of a pulse length or in terms of the applied voltage.

FIG. 11d illustrates a timing diagram in the case of a read operation, a pulse being applied to the "CL" line, while a potential of the "PL" line is increased in ramped fashion in the direction of the full supply voltage. The nodes 5 and 6 are charged at different speeds depending on the resistance of the PCM elements. During the ramped increase in the potential of the "PL" line, the supply voltage for the inverters is switched on, so that the inverters output the output signals in accordance with the precharged nodes 5 and 6.

What may be disadvantageous about the above cell is that the read-out may be susceptible to errors. What may furthermore be disadvantageous is that a destructive read out of the PCM elements involving the erasure of the stored information during read-out may, in some cases, only be prevented by means of a precise voltage ramp on the "PL" line. This may increase the production costs because components having smaller tolerances may have to be provided for this purpose. Moreover, on account of the precise control which may be used in order to avoid the read-out errors, the control outlay may be increased, which may entail an increase in complexity. Furthermore, the n MOS pass transistors may not be able to transmit the full voltage swing, whereby an error-free execution of the write operation may be prevented in the case of the PCM elements. The write operation may furthermore be inflexible because either the pulse length is changed for the set/reset operation (more precise specifications made of the PCM technology) or a second supply voltage may be used, which may be associated with additional costs.

A further possible disadvantage of the known cell may be that after the supply voltage has been switched off, the sequence of the precisely highly ramped "PL" signal synchronized with a distinct ramp of the total supply voltage, and a pulse of the "CL" signal may use a high outlay in order to ensure a robust reestablishment of the correct values, and in order to prevent a destructive read-out.

The prior art, e.g. US 2004/0141363 A1, discloses writing mechanisms in which a high or a low resistance state is stored (that is to say, written) in the programmable PCM element either by changing a duration of a width of a programming current pulse, as illustrated in FIG. 12a, or by applying a higher voltage, as illustrated in FIG. 4b. What may be disadvantageous in this case is that exclusively changing the current pulse width may make requirements of PCM technology which are currently not met by most PCM process technologies. The provision of different voltage levels may not be expedient either. In many applications, there may be no second suitable voltage supply on the chip. Generation and distribution of a second voltage by means of a charge pump are associated with an additional area consumption and thus with additional costs. Furthermore, deriving a voltage having a low voltage value from a voltage having a higher voltage value causes not only a control outlay (overhead) but also problems on account of a reduced signal swing.

SUMMARY OF THE INVENTION

One object of the invention is to provide an efficient concept for writing to and reading from memory elements having resistance elements which have different resistance values in different states, a single supply voltage being used both for writing and for reading out.

Embodiments of the invention are based on the insight that when writing to the memory element, that is to say when converting the resistance elements into the states characteristic of the resistance values, a second supply voltage can be dispensed with if the resistance elements are converted into the respective states at the same voltage exclusively by means of currents.

If the resistance elements are, for example, the PCM elements already mentioned, then it is possible, according to embodiments of the invention, to realise the transition from a crystalline state, which is characterized by a low resistance value, into an amorphous state, which is characterized by a high resistance value, by generating through the resistance element a current with an amplitude that is sufficient to generate enough heat, so that the state transition takes place. If, by contrast, there should be a change from the amorphous state into the crystalline state, then a current with a, for example, lower amplitude is generated through the resistance element that is in the amorphous state, so that enough heat is generated in order to convert the resistance element from the amorphous state into the crystalline, for example, into the polycrystalline state.

In order to enable a current of a high amplitude, an activation voltage may be generated across a PCM element, which activation voltage may lie in the region of 1 V (e.g. 0.8 V-0.9 V or 0.9 V-1 V). If the activation voltage is exceeded, then the linear current-voltage relationship in accordance with Ohm's law may not be applicable. Therefore, a current with a large amplitude may be generated by means of a relatively small change in voltage. An explanation of the current-voltage dependence in the case of PCM elements may be found in A. Pirovano, A. L. Lacaita: Low-Field Amorphous State Resistance and Threshold Voltage Drift in Chalcogenide Materials, IEEE Transactions on Electronic Devices, Vol. 51, No. 5, May 2004 and in A. Redelli et al.: Electronic Switching Effect and Phase-Change Transition in Calcogenide Materials, IEEE Electronic Device Letters, Vol. 25, No. 10, October 2004.

In order to minimize the power that is additionally to be generated with the aid of current or in order for example to shorten the switching times, it may be advantageous for a higher voltage, for example 1.2 V or 1.5 V, to be generated across the resistance element. Consequently, the resistance element can, for example be converted into the respective state more rapidly. However, a higher voltage may have the effect that the state of the resistance element is changed during the read-out of the memory cell, which is tantamount to an erasure of the stored information (destructive read-out). This may be problematic in particular when the memory element has a further resistance element in addition to the resistance element, a ratio of the resistance values of the resistance element and of the further resistance element representing the memory state. In this case, during the read-out of the memory cell, there may be occurrence of the case that a higher voltage is dropped across the resistance element having the higher resistance value, which higher voltage may lead to a reprogramming of the resistance element in the case of which the resistance element is converted into a different state. In order to prevent the destructive read-out, in accordance with one embodiment of the invention, during the read-out of the memory element, a potential difference is reduced across that resistance element which has a larger resistance value. Consequently, despite the higher voltage, which may be advantageous in the case of writing to the elements, it is nevertheless possible to prevent a reprogramming of the resistance elements from occurring during read-out of the memory element.

One advantage of the following invention resides in the fact that a single supply voltage may be sufficient to convert the resistance elements into both states. The circuits according to embodiments of the invention may therefore operate with a single supply voltage. On account of the current control, a higher voltage, e.g., a further supply voltage, in order, e.g., to carry out a reset, may not be used, however.

A further advantage is to be seen in the fact that the control outlay may be low. A current generating device, which may comprise, e.g., a current source, may be used for generating the currents. If the current generating device comprises two transistors, for example, each resistance element being assigned a transistor, then the setting and the resetting (set/reset) of the resistance elements into the respective states can be controlled separately.

The concept according to embodiments of the invention is furthermore distinguished by high flexibility, because a current amplitude and a pulse width can be set depending on the set and reset operation to be carried out, as a result of which a use of a simple PCM process technology is also made possible.

A further advantage is that the pulse widths may be symmetrical. A change in the current amplitude enables a use of writing pulses having identical pulse lengths for the setting and for the resetting of the resistance elements. In the case of adapting PCM process technology to the concept according to embodiments of the invention, the pulse widths or else the pulse amplitudes could be reduced, by way of example, as a result of which a power reduction could be achieved, by way of example.

The concept according to embodiments of the invention is not restricted to PCM elements, but rather can be used wherever information storage can be carried out with the aid of resistance elements which can reversibly assume at least two states (e.g., magnetoresistive elements).

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Further exemplary embodiments of the invention are explained with reference to the accompanying drawings, in which:

FIGS. 11b-11d show timing diagrams for the memory cell from FIG. 11a; and

DETAILED DESCRIPTION OF THE PREFERRED EMBODIMENT

Figure 1:
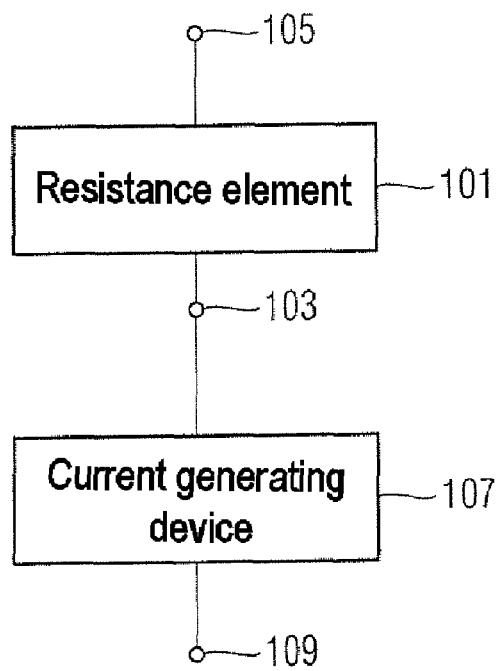
FIG. 1 shows a basic block diagram of a memory element according to the invention in accordance with one exemplary embodiment.

In one embodiment, the memory element illustrated in FIG. 1 comprises a resistance element 101 having a first terminal 103 and a second terminal 105. The memory element furthermore comprises a current generating device 107, the output of which is coupled, for example, electrically connected, to the first terminal 103 of the resistance element 101.

The current generating device 107 may furthermore comprise a terminal 109, to which a reference potential, for example, an earth potential, can be applied.

The resistance element 101 has a first resistance value in a first state and a second resistance value in a second state, the two resistance values being different from one another. Furthermore, the states are reversible so that the resistance element 101 can be converted both from the first state into the second state and from the second state into the first state. The resistance element 101 may be a PCM element, for example, in which the first state is an amorphous state, for example, and in which the second state is a crystalline state, for example a polycrystalline state, which is assumed hereinafter. However, the following explanations also hold true for the case where the first state is the crystalline state and the second state is an amorphous state, and also for the case where the resistance element 101 is not a PCM element.

In one embodiment, the current generating device 107 is designed to generate a current with a first amplitude through the resistance element 101 when a predetermined potential, for example the supply potential is present at the second terminal 105 of the resistance element 101, in order to convert the resistance element into the first state for setting the first resistance value, and/or to generate a current with a second amplitude, which differs from the first amplitude through the resistance element 101 when the predetermined potential is present at the second terminal 105 of the resistance element 101, in order to convert the resistance element into the second state for setting the second resistance value.

If the first state of the resistance element 101 is an amorphous state, then the resistance value is approximately 1 MΩ. If the second state is the crystalline state, then the second resistance value is approximately 10 kΩ, for example. The first amplitude may be 200 µA, for example, and the second amplitude may be 50 µA, for example.

In order to write to the resistance element 101, the memory element illustrated in FIG. 1 may be designed to apply the predetermined potential, for example the supply potential (supply voltage) of 1.2 V-1.5 V or 3 V, to the second terminal 105 of the resistance element 101. In order to generate the activation voltage (for example, 0.8 V, 0.9 V or 1 V), already mentioned, across the resistance element, the memory element may furthermore be designed to apply a reference potential, for example, an earth potential, to the terminal 109 of the current generating device 107, so that a potential difference which exceeds the activation voltage, for example, is formed between the terminals 103 and 105 of the resistance element 103. However, the predetermined potential may also be a reference potential which represents an earth potential, for example, and which differs from the supply potential.

The memory element illustrated in FIG. 1 may, as already mentioned, be designed to apply the predetermined potential to the terminal 105 of the resistance element 101 and to apply the reference potential to the terminal 109 of the current generating device 107. For this purpose, the memory element may have a voltage controller, for example, which is designed to apply the potentials to the terminals 105 and 109, for example when writing to the resistance element 101. In accordance with a further embodiment, however, the terminals 105 and 109 may be connected to voltage supply terminals.

According to embodiments of the invention, the current generating device 107 may be designed to generate the current with the first amplitude for a first time duration, and to generate the current with the second amplitude for a second time duration, so that current pulses having identical pulse widths and different pulse amplitudes arise.

In accordance with a further embodiment, however, it is possible for the two pulses to have different pulse widths as well as different amplitudes so that the pulse width can be utilized as an additional degree of freedom for the control.

In accordance with one embodiment, the current generating device 107 comprises a current source designed to generate the currents with a first and/or with a second amplitude. In accordance with a further embodiment, the current generating device 107 may be designed to limit an amplitude of a current to the first and/or to the second amplitude. For this purpose, the current generating device 107 may have a transistor circuit.

Figure 2:
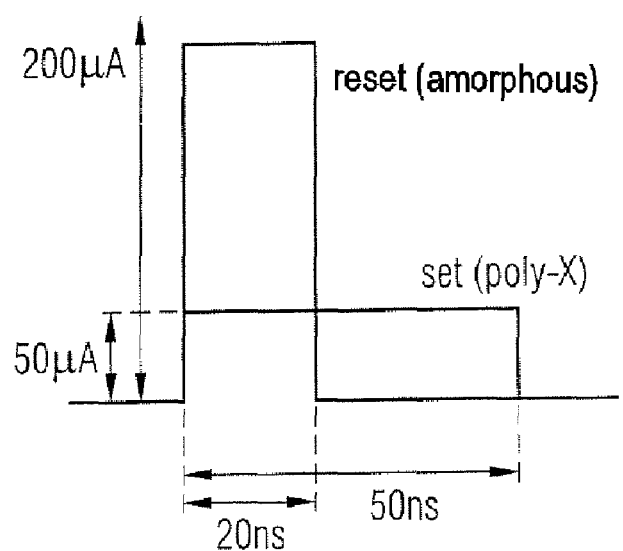
FIG. 2 shows programming currents for PCM elements.

FIG. 2 shows an example of (idealized) programming currents for programming PCM elements. The pulse with the amplitude 200 µA may be used to reset the resistance element into the amorphous state, the pulse width being 20 ns (reset, amorphous). FIG. 2 furthermore illustrates a further current pulse with the amplitude 50 µA, which is generated for converting the resistance element into the polycrystalline state, in which case the pulse duration may be for example 50 ns (set, poly X). As mentioned above, however, the two pulses may have identical pulse widths of between 20-50 ns.

In accordance with a further embodiment, the first and the second amplitudes may be identical. In this case, currents having identical amplitudes and different time durations are generated in order to convert the resistance element into the first state or into the second state.

The circuits according to embodiments of the invention generally relate to memory cells which use resistance elements R which can be programmed to be ideally either conducting (R=0 Ω) or non-conducting (R=∞). The resistance elements may be programmed, for example by a current for a predetermined time duration, as illustrated, for example, in FIG. 2. The programmed resistance value is retained even in the absence of a supply voltage. Consequently, the implementation according to embodiments of the invention yields non-volatile memory elements or non-volatile memory cells. A resistance element is programmed with the aid of a current, so that a second supply voltage may not be used. Since the resistance elements can be implemented in the upper layers, for example on a metal stack of a CMOS process, on an upper end of a transistor, the solution according to embodiments of the invention may be efficient in respect of area.

In accordance with a further embodiment, the following invention yields basic circuits designed to carry out the set and reset operations according to embodiments of the invention. The solutions according to embodiments of the invention permit variation of an amplitude of a programming current during the set and reset operation. The programming current is the current which is generated through the resistance element for converting the resistance element into the first state or into the second state. In accordance with one embodiment of the invention, the amplitudes of the programming currents may lie in the range of the typical $I_{on}$ currents (switch-on currents) of the transistors in present-day CMOS process technologies. A transistor can therefore be used to limit a maximum current through the resistance element, in order, e.g., to avoid damage to the latter or a destructive read-out.

Figure 3A:
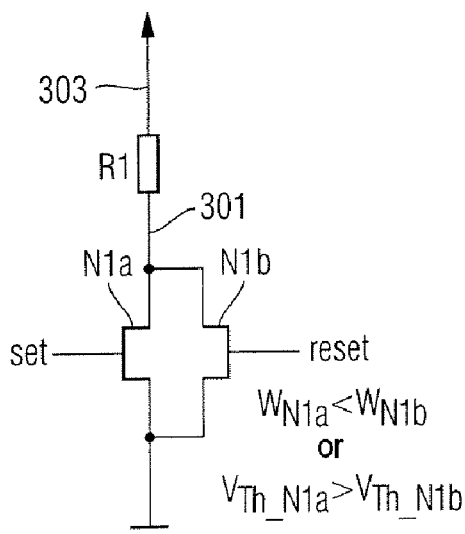
FIGS. 3a-3d show memory elements in accordance with further exemplary embodiments of the invention.

FIG. 3a shows a memory element having a resistance element R1, which has a first terminal 301 and a second terminal 303. The memory element furthermore comprises a current generating device coupled to the first terminal 301 of the resistance element R1. The current generating device comprises a first transistor N1b for generating the current with the first amplitude and a second transistor N1a for generating the current with the second amplitude. A first terminal of the transistor N1a is connected to a first terminal of the transistor N1b. A second terminal of the transistor N1a is connected to a second terminal of the transistor N1b. The second terminals of the transistors N1a and N1b are connected to the first terminal 301 of the resistance element R1. As illustrated in FIG. 3a, the first terminals of the transistors N1a and N1b are connected to an earth potential, which represents the reference potential. By contrast, the second terminal 303 of the resistance element R1 is connected to the predetermined potential, which is a supply potential (e.g. 1.2 V or 1.5 V).

The transistors N1a and N1b may be N-channel field effect transistors, for example. In order to generate the currents with the amplitude having different magnitudes, a gate width $W_{Na}$ of the transistor N1a may be less than a gate width $W_{N1b}$ of the transistor N1b. In accordance with a further embodiment, the transistors N1a and N1b may be configured in such a way that a threshold voltage $V_{Th\_N1b}$ of the transistor N1b is less than a threshold voltage $V_{Th\_N1a}$ of the transistor N1a.

In one embodiment, the transistors N1a and N1b have control terminals (control inputs), to which control signals (set and reset) can be applied. When the reset control signal is applied to the control terminal of the transistor N1b, for example, the current with the first amplitude is generated in order to convert the resistance element R1 into the first state, which may be, for example, the amorphous state in the case of PCM elements. When a set control signal is applied to the control terminal of the transistor N1a, by contrast, a current with the second amplitude is generated in order to convert the resistance element R1 into the second state, which may be a crystalline state. The set control signal and the reset control signal may be complementary signals, so that only one of the transistors N1a and N1b is active at a point in time.

Figure 3B:
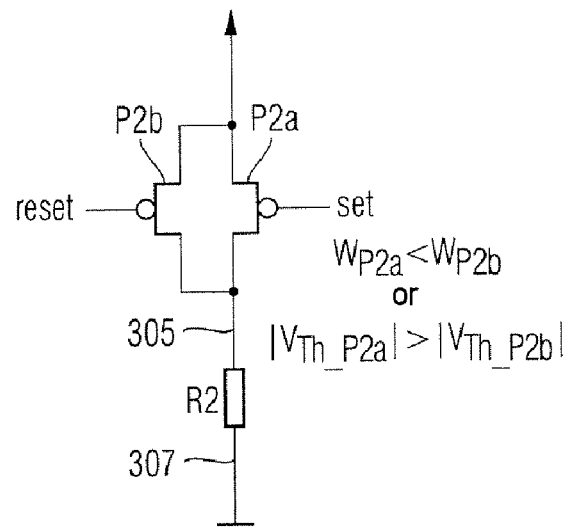

FIG. 3b shows a memory element in accordance with a further exemplary embodiment of the invention. The memory element comprises a resistance element R2 having a first terminal 305 and a second terminal 307, and a current generating device comprising a first transistor P2b and a second transistor P2a. The transistors are connected to one another, as illustrated in FIG. 3a. In particular the first terminals of the transistors P2b and P2a are connected to the first terminal 305 of the resistance element R2.

In contrast to the exemplary embodiment illustrated in FIG. 3a, the second terminal 307 of the resistance element R2 is connected to the earth potential, which represents a reference potential. Meanwhile, the second terminals of the transistors P2b and P2a are connected to the supply potential, which represents the predetermined potential and is identified by an arrow.

The transistor P2b may be designed to generate the current with the first amplitude in order to convert the resistance element R2 into the first state, which may be the amorphous state. By contrast, the second transistor P2a may be designed to generate the current with the second amplitude, in order to convert the resistance element R2 into the second state, for example into the crystalline state. The control of the transistors corresponds to the control described in connection with the exemplary embodiment illustrated in FIG. 3a. A gate width $W_{P2b}$ of the transistor P2b is e.g. greater than a gate width $W_{P2a}$ of the transistor P2a. In accordance with a further embodiment, a magnitude $|V_{Th\_P2a}|$ of the threshold voltage of the transistor P2a may be greater than a magnitude of $I|V_{ThP2b}|$ of the threshold voltage of the transistor P2b.

The different arrangement of the current generating devices illustrated in FIGS. 3a and 3b is due to the fact that the current generating device from FIG. 3a is constructed from N-channel field effect transistors and the current generating device from FIG. 3b is constructed from P-channel field effect transistors. Upon an activation of one of the transistors N1a or N1b from FIG. 3a, the earth potential is transmitted to the first terminal 301 of the resistance element R1 largely in an uncorrupted manner, so that the desired potential difference between the supply potential and reference potential is established across the resistance element R1. Upon an activation of one of the transistors P2b or P2a from FIG. 3b, by contrast, the supply potential is transmitted to the terminal 305 of the resistance element R2 largely in an uncorrupted manner, so that the desired potential difference between the supply potential and the earth potential is established across the resistance element R2.

According to embodiments of the invention, the set signals from FIGS. 3a and 3b and the reset signals may be respectively complementary signals. Therefore, by way of example, the transistors N1a and P2b can be activated simultaneously using a signal and the complementary version thereof.

The current generating device according to one embodiment of the invention is generally designed to generate a current with the first amplitude through the resistance element when a predetermined voltage (potential difference) is present across the resistance element, in order to convert the resistance element into the first state for setting the first resistance value, and/or to generate a current with the second amplitude through the resistance element when the predetermined voltage is present across the resistance element, in order to convert the resistance element into the second state for setting the second resistance value. The predetermined voltage is determined by a difference between the potentials that can be applied to the terminals of the resistance element, for example supply potential and reference potential, which may be an earth potential. Consequently, only one voltage source may be used in order to convert the resistance element into the first state and/or into the second state. The predetermined voltage may be a voltage which exceeds the activation voltage of 1-3 V already mentioned.

Figure 3C:
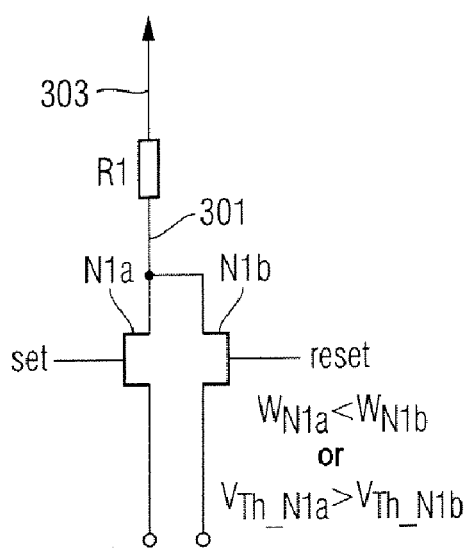

FIG. 3c shows a further exemplary embodiment of a memory element. In contrast to the exemplary embodiment illustrated in FIG. 3a, the second terminals of the transistors N1a and N1b are embodied separately and are not connected to one another. This enables the reference potentials to be applied to the second terminals of the transistors N1a and N1b independently of one another. The pulse width of the currents generated can thus be controlled by application of the reference voltage to the second terminals of the transistors.

Figure 3D:
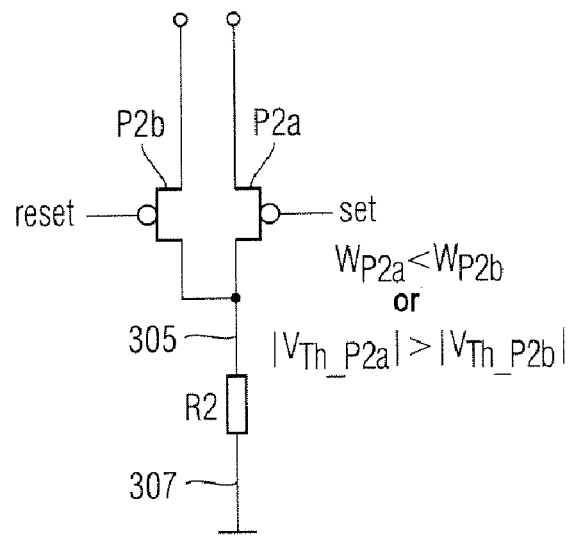

FIG. 3d shows a further exemplary embodiment of a memory element. The difference from the exemplary embodiment illustrated in FIG. 3b is that the second terminals of the transistors P2a and P2b are separate from one another, so that a supply potential, for example, can be applied to these, independently of one another.

The circuits illustrated in FIGS. 3a to 3d generate two different programming currents using two transistors. One of the transistors is designed to generate a relatively high $I_{on}$ for the reset operation (e.g. conversion into the first state). The other transistor is designed to generate a relatively low $I_{on}$ for the set operation (e.g. conversion into the first state). The current $I_{on}$ may be varied by means of a choice of a different width/length ratio of the gate regions of the transistors or the different threshold voltage of the transistors.

Figure 4A:
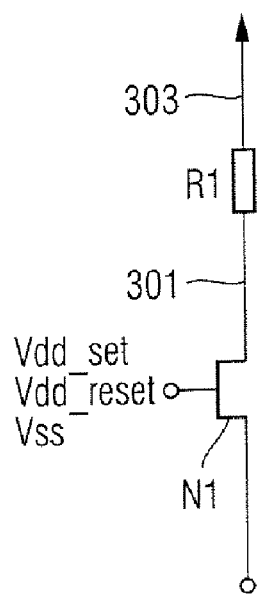
FIGS. 4a-4f show memory elements in accordance with further exemplary embodiments of the invention.

FIG. 4a shows a memory element in accordance with a further exemplary embodiment. In contrast to the exemplary embodiment illustrated in FIG. 3a, the current generating device comprises a single transistor N1, which may be an N-channel field effect transistor. A first terminal of the transistor N1 is connected to the first terminal 301 of the resistance element 303. A reference potential, for example an earth potential, can be applied to a second terminal of the transistor N1 in order to generate the desired potential difference across the resistance element R1. The current with the first amplitude and the current with the second amplitude are generated by application of different potentials to a control input of the transistor N1. The pass transistor N1 can be activated, for example, with the aid of a high level (H level, Vdd_set), which may be derived, e.g., from the supply voltage (by means of, e.g., a pass transistor or a voltage divider) and which may be used in order to convert the transistor N1 into a conductive state. However, the pass transistor N1 can be activated with a higher voltage level (Vdd_reset), e.g., with the supply voltage level which converts the pass transistor N1 into an overdrive mode, which enables a higher $I_{on}$. Furthermore, Vss can be applied to the control terminal (gate terminal) of the transistor N1 in order to open the transistor.

By means of a slight alteration of, e.g., the gate voltage, a current with a large amplitude can therefore be obtained with use being made of a non-linear current-voltage characteristic curve of a field effect transistor. Consequently, in the case of a substrate control, by way of example, it is possible to carry out the reset with a smaller voltage swing.

Figure 4B:
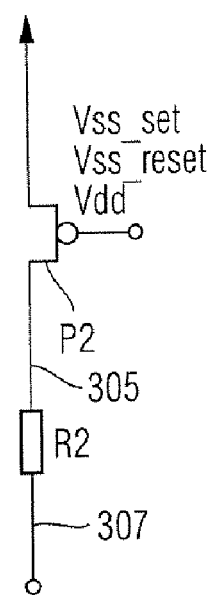

FIG. 4b shows a further exemplary embodiment of a memory element according to one embodiment of the invention. In contrast to the exemplary embodiment illustrated in FIG. 3b, the current generating device comprises a single P-channel field effect transistor P2, the first terminal of which is connected to the first terminal 305 of the resistance element R2. In order to generate a current with the first amplitude, a potential Vss_reset is applied to a control terminal (gate terminal) of the transistor P2. In order to generate a current with the second amplitude, by contrast, Vss_set is applied. Vdd is applied to the control input of the transistor P2 in order to open the latter. A second terminal of the transistor P2 is connected, for example to a supply potential identified by an arrow, so that the supply potential, upon activation of P2, is transmitted to the first terminal 305 of the resistance element R2 in an uncorrupted manner.

Figure 4C:
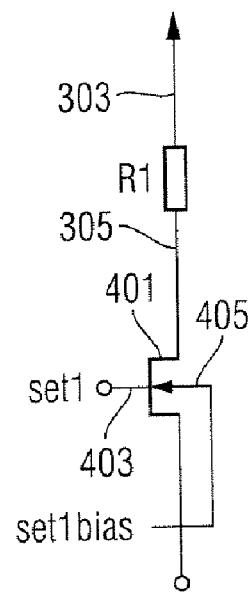

FIG. 4c shows a further exemplary embodiment of a memory element. In contrast to the exemplary embodiment illustrated in FIG. 4a, the memory element illustrated in FIG. 4c comprises a transistor 401 which may be an N-channel transistor. A first terminal of the transistor 401 is coupled to the first terminal 305 of the resistance element R1. A reference potential, for example an earth potential can be applied to a second terminal of the transistor 401. The transistor 401 furthermore has a first control terminal 403, which may be a gate terminal, by way of example. The transistor 401 furthermore comprises a second control terminal 405, which may be a substrate terminal (e.g. bulk terminal).

Figure 4D:
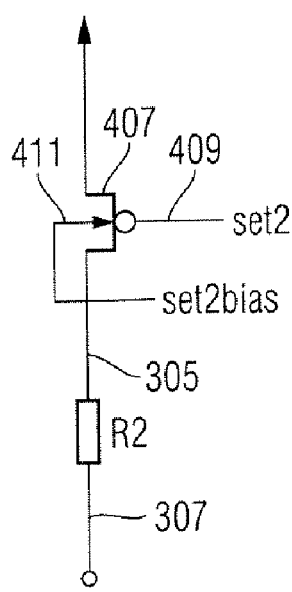

FIG. 4d shows a further exemplary embodiment of a memory element according to one embodiment of the invention, which, in contrast to the exemplary embodiment illustrated in FIG. 4b has a transistor 407 which may be a P-channel field effect transistor. A first terminal of the transistor 407 is connected to the first terminal 305 of the resistance element R2. By way of example, a supply potential indicated by the arrow can be applied to a second terminal of the transistor 407. The transistor 407 furthermore comprises a first control terminal 409, which may be a gate terminal and a second terminal 411 which may be a bulk terminal.

In the exemplary embodiments illustrated in FIGS. 4c and 4d, the current generating device is formed by the transistors 401 and 407, respectively. For the purpose of generating the currents with the first and second amplitudes, a signal set 1, by way of example, is applied to the first control input 403 of the transistor 401 in order to activate the transistor 401. By contrast, the current amplitude can be set by means of the signal set1bias that is to be applied to the second control terminal 405 (bulk terminal). For the purpose of generating a current with the first amplitude or with the second amplitude, in accordance with the exemplary embodiment illustrated in FIG. 4d, a signal set2 is applied to the first control terminal 409 of the transistor 407 in order to activate the transistor. The current amplitude can be set for example via the bulk terminal 411 with the aid of the signal set2bias. As illustrated in FIGS. 4c and 4d, operation in the reverse direction and/or in the forward direction (reverse biasing, forward biasing) is carried out in order to realize the different programming currents. The voltage levels for biasing may be provided in particular in the circuits in which biasing is used, e.g., for leakage minimization (back-biasing) or for speed control (forward-biasing) for the logic circuits, (e.g. triple-well process transistors).

Figure 4E:
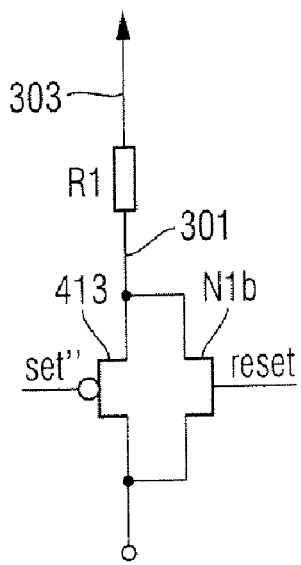

FIG. 4e shows a further exemplary embodiment of a memory element according to one embodiment of the invention. The current generating device comprises the transistor N1b and also a transistor 413, which may be a P-channel field effect transistor (e.g. P2a from FIG. 3b). The first terminals of the transistors 413 and N1b are connected to one another and to the first terminal 301 of the resistance element R1. The second terminals of the transistors 413 and N1b are connected to one another, it being possible for a reference potential, for example an earth potential, to be applied to them.

Figure 4F:
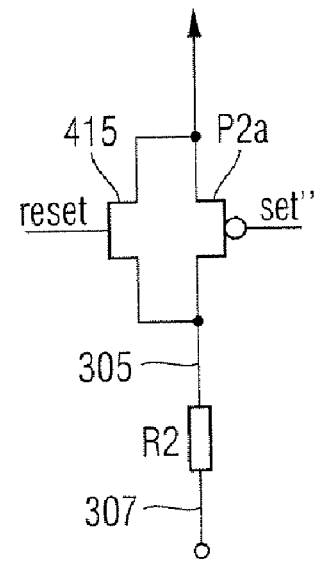

FIG. 4f shows a further exemplary embodiment of a memory element according to one embodiment of the invention with a current generating device comprising the transistor P2a and also a transistor 415, which may be an N-channel field effect transistor, for example the transistor N1a from FIG. 3a. The signals set" and reset" that can be applied to the control inputs of the transistors illustrated in FIGS. 4e and 4f are complementary to one another.

In the exemplary embodiments illustrated in FIGS. 4e and 4f, different elements are used for the set operation or for the reset operation. In order to enable a high current (and in order to enable transmission of the voltage Vss level) an NMOS element 413 or 413 is used for the reset operation. In order to enable a lower current (and in order to enable only a transmission of the voltage level VSS−Vth_pmos), e.g., a PMOS element 413 or 413 is used for the set operation.

As illustrated in FIGS. 3a to 3d and 4a to 4f, the programming currents are set via the control terminals of the respective transistors. In general, the current generating device according to one embodiment of the invention is controllable and designed, for example to receive a first control signal and, responding to the first control signal, to generate the current with the first amplitude, and to receive a second control signal, and, responding to the second control signal, to generate the current with the second amplitude. The control signals may be, for example, the control signals set, reset, Vdd_set, Vdd_reset, Vss, Vss_set, Vss_reset, Vdd, set1, set1bias, set2, set2bias or set" as illustrated in FIGS. 3a to 3d and 4a and 4f.

In accordance with a further embodiment, the memory element may have a control element designed to generate the first control signal and/or to generate the second control signal. The control element may be designed, for example to receive data with different signal levels and to generate the first or the second control signal in the manner dependent on the signal levels.

In accordance with a further embodiment, the memory element comprises a further resistance element having a first resistance value in the first state and a second resistance value in the second state. The further resistance element and the resistance element may be identical. The current generating device may, for example, be coupled to a first terminal of the further resistance element and be designed to generate a current with the first or second amplitude through the further resistance element when the predetermined potential is present at the second terminal of the further resistance element, in order to convert the further resistance element into the first state or into the second state. To express it another way, the current generating device may be designed to generate the current with the first amplitude or with the second amplitude in the event of a predetermined voltage (potential difference between the potentials present at the terminals of the further resistance element) across the further resistance element, the predetermined voltage having a voltage value which may be used in order to enable a current flow through the further resistance element. Consequently, a memory state of the memory element may be represented for example by a ratio of the resistance values of the resistance element and of the further resistance element. The conversion of the further resistance element into the respective state may be carried out in the manner already described in connection with the resistance element.

If the pass transistors are for example transistors having a threshold voltage of 500 mV which corresponds e.g. to a nominal voltage of a 90 nm CMOS process with high-Vt transistors (high threshold voltage transistors) then the supply voltage (or the supply potential) may be e.g. 1.2 V.

In accordance with a further embodiment, one embodiment of the invention provides a memory read-out element, which is designed to read out a memory state of a memory element.

According to one embodiment of the invention, the memory read-out element comprises a potential reduction device designed to reduce a potential at the resistance element during the read-out of the memory element if the resistance value is greater than the further resistance value, or to reduce a potential at the further resistance element during the read-out of the memory element if the further resistance value is greater than the resistance value. The potential reduction device may, e.g., be designed to reduce the potential present at a terminal of the resistance element with regard to a potential present at a further terminal of the resistance element, so that a potential difference across the resistance element is reduced, as a result of which a destructive read-out can be prevented.

If, by way of example, a supply potential is present at a first terminal of the first resistance element and an earth potential is present at a second terminal of the resistance element, then the potential difference across the resistance element (that is to say the voltage) may be too high, so that, during the read-out of the resistance element, the state thereof is changed and the stored information is thus erased (destructive read-out). In order to prevent this and in order nevertheless to enable the use of a single supply voltage, the potential reduction device may be designed to reduce the potential at the resistance element. In this case, the potential may be reduced with respect to a further potential. If, by way of example, the supply potential is present at the first terminal of the resistance element, then the potential reduction device is designed to increase the potential at the second terminal of the resistance element in relation to the potential at the first terminal of the resistance element, so that the potential difference is reduced. This may be used to increase the potential of the second terminal of the resistance element, in the case of a positive supply voltage, with respect to the earth potential.

In one embodiment, in order to reduce the potential difference across the resistance element, the potential reduction device may, however, be designed to reduce the supply potential present at the first terminal of the resistance element with regard to the reference potential, e.g., earth potential present at the second terminal.

In order to read out the memory state of the memory element, in accordance with one embodiment the memory read-out element may be designed to apply a first potential, for example the supply potential, to a terminal of the resistance element and to apply a second potential, for example a reference potential, which may be an earth potential to a terminal of the further resistance element, so that a potential difference representing the memory state of the memory element is formed across the resistance element and across the further resistance element. The memory read-out element may, furthermore, be designed to tap off a potential at a node between the two coupled resistance elements, in order to read out the memory state, the potential representing the memory state.

In accordance with a further embodiment, the potential reduction device comprises a switch, which is coupled to the resistance element and forms a first arrangement with the latter, and a further switch, which is coupled to the further resistance element and forms a second arrangement with the latter. The first arrangement and the second arrangement are connected in series, for example, and connected via a node. The memory read-out element may be designed to generate a voltage across the first arrangement, to generate a voltage across the second arrangement, to simultaneously activate the switch and the further switch, to generate a potential representing the memory state at the node, and to tap off the potential for the purpose of reading out the memory state.

In order to achieve the desired potential reduction, the switch may be designed to generate a voltage, for example a counter-voltage, which has dropped across the switch and which is greater than a voltage dropped across the further switch if the resistance value is greater than the further resistance value, in order to reduce a voltage across the resistance element, thereby preventing a destructive read-out. Analogously, the further switch may be designed to generate a voltage which has dropped across the further switch, for example a counter-voltage, and which is greater than a voltage dropped across the switch if the further resistance value is greater than the resistance value, so that a voltage across the further resistance element is reduced.

Figure 5A:
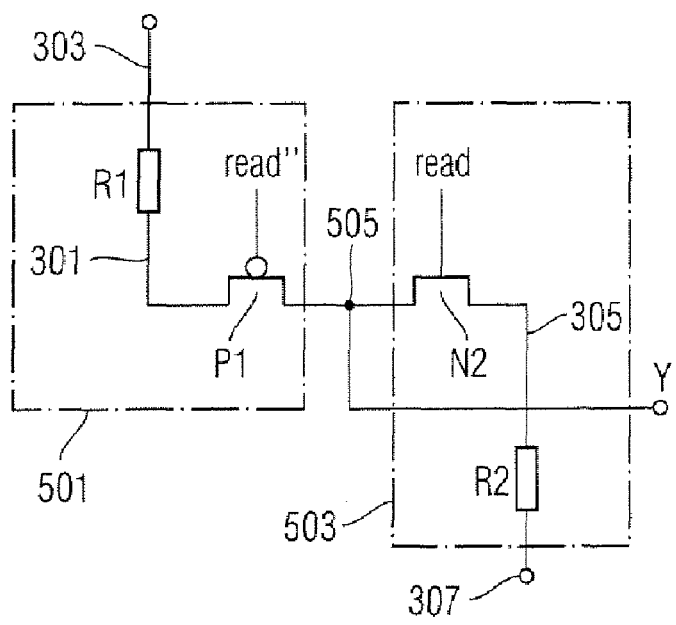
FIG. 5a shows a memory read-out element in accordance with one exemplary embodiment of the invention.

FIG. 5a shows a memory read-out element in accordance with one exemplary embodiment of the invention. The memory read-out element comprises the resistance element R1 connected in series with a P-channel field effect transistor P1, whereby a first arrangement 501 is formed. The memory read-out element furthermore comprises the second resistance element R2 connected in series with an N-channel field effect transistor N2, whereby a second arrangement 503 is formed. The transistors P1 and N2 are connected to one another via a node 505. The two transistors P1 and N2 are simultaneously activated with the aid of the signals read" and read, which are complementary to one another.

For the purpose of reading out the memory state, the memory element may be designed to apply the supply potential to the first terminal 303 of the resistance element R1 and the reference potential, for example the earth potential to the second terminal 307 of the resistance element R2. If the resistance element R1 is in a high-resistance state and if the resistance element R2 is in a low-resistance state, then when the switches P1 and N2 are activated simultaneously, the lower reference potential is transmitted to the node 505 via the transistor N2 and thus represents the memory state. At the same time, the transistor P1 generates a threshold voltage which is dropped across P1 and which reduces a potential difference across R1, thereby preventing a destructive read-out.

If, by way of example, the resistance element R1 is in a low-resistance state and the resistance element R2 is in a high-resistance state, then when the switches P1 and N2 are activated simultaneously, the high supply potential is transmitted to the point 505 via the switch P1. At the same time, the transistor N2 generates a threshold voltage which reduces the potential difference across R2 and thus counteracts a destructive read-out. The potential at the node 505 thus represents the memory state for this combination of resistance values and can be tapped off via a terminal Y, for example, which is connected to the node 503. This task may be performed by the memory read-out element, for example. The memory read-out element may furthermore be designed to apply the potentials to the terminals 303 and 307 of the resistance elements. In accordance with a further embodiment, the terminals 303 and 307 may be fixedly connected to potential planes.

Figure 5B:
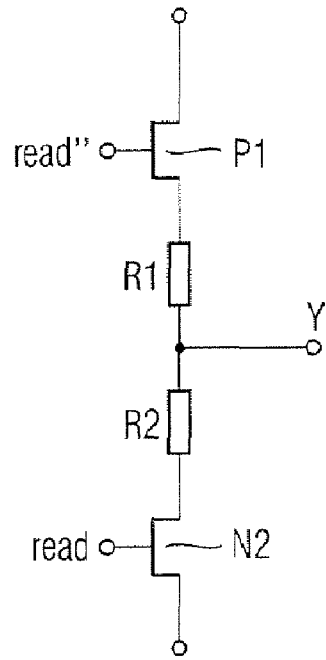
FIGS. 5b-5c show memory read-out elements in accordance with further exemplary embodiments of the invention.

FIG. 5b shows a further exemplary embodiment of a memory read-out element. In contrast to the exemplary embodiment illustrated in FIG. 5a, the order of the elements in the respective series circuit comprising the transistor P1 and the resistance element R1 and also comprising the transistor N2 and the resistance element R2 has been interchanged. For the purpose of reading out the memory state, the supply potential and reference potential, for example, are applied to the free terminals of the transistors P1 and N2, that is to say to the terminals which are not connected to one of the resistance elements, so that a potential which is established upon activation of the transistors P1 and N2 can be tapped off via the tapping point Y.

When the supply potential is present at the free terminal of the transistor N2 and when the reference potential is present at the free terminal of the transistor P1, threshold voltages are dropped across P1 and N2, so that a reduced voltage swing is transmitted to Y. The arrangement is nevertheless advantageous because when P1 and N2 are simultaneously deactivated, the resistance elements R1 and R2 are completely decoupled, e.g., from external terminal points. If, by way of example, a load capacitance is connected to Y, then no leakage current will form through the resistance elements, which results in increased stability of the memory element. The smaller voltage swing may be detected, e.g., by a detector, the decision threshold of which already takes account of the reduced voltage swing.

Figure 5C:
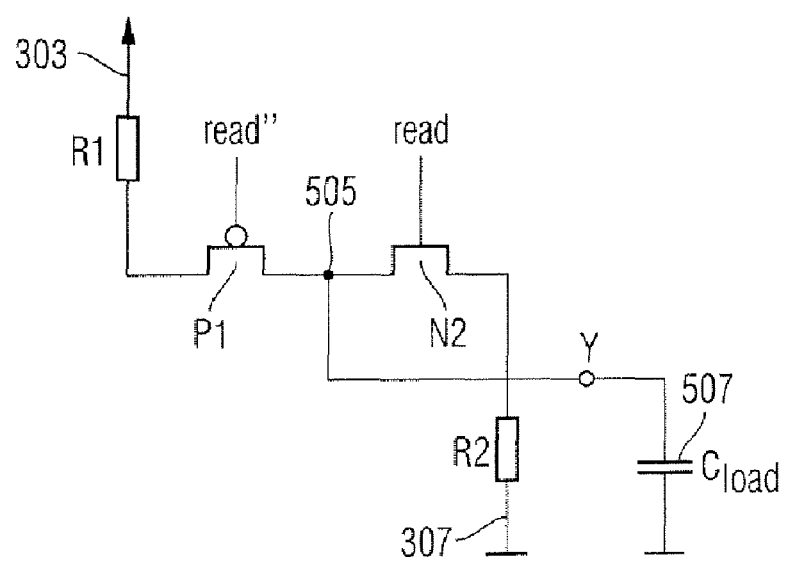

FIG. 5c shows a further exemplary embodiment of a memory read-out element. In contrast to the memory read-out element illustrated in FIG. 5a, the memory read-out element illustrated in FIG. 5c comprises a capacitance 507 (capacitance element $C_{load}$) connected between the node 505 and earth. The second terminal 303 of the resistance element R1 is connected to the supply potential and the second terminal 307 of the resistance element R2 is connected to the earth potential.

The exemplary embodiments of the memory elements for the read-out of two complementary resistance elements as illustrated in FIGS. 5a to 5c in each case use pass transistors in order to isolate the resistance elements from an output node and also to prevent a current flow through the resistance elements. During the read-out operation, the "read" signal becomes active and at the output Y a voltage is generated which depends on the resistance values of the two elements R1 and R2. In the case of a permanent read-out, the output load $C_{load}$ stores an output value which could be regularly stabilized by a pulsed "read" signal (refresh). It is assumed, however, that a short read-out pulse is sufficient to discharge, charge/refresh the output load, whereupon a long period of an inactive read-out signal ensues. PCM elements are usually read at a lower voltage than during the write operation, in order to prevent a destructive read-out. With the read-out mechanism according to one embodiment of the invention, the same voltage can be used for read-out and for writing. One implementation is shown in FIG. 5a. FIG. 5b shows an alternative solution. FIG. 5c shows an exemplary embodiment of a circuit which transmits an information bit stored in the memory cell to the load capacitance $C_{load}$.

The pass transistors illustrated in FIGS. 5a to 5c may, furthermore, be implemented with the aid of other types of transistor, such as, e.g., two NMOS transistors. Although two pass transistor of the same type could be implemented more simply on account of the same polarity of the control signals and the possibility of a denser layout, it would not be possible here to transmit the full voltage swing.

One embodiment of the invention furthermore provides a memory cell having a memory element according and a memory read-out element, the memory element having a further resistance element. The resistance element and the further resistance element may be converted into complementary states, so that a ratio of the resistance values which are established in the states represents the memory state or the memory content.

Figure 6A:
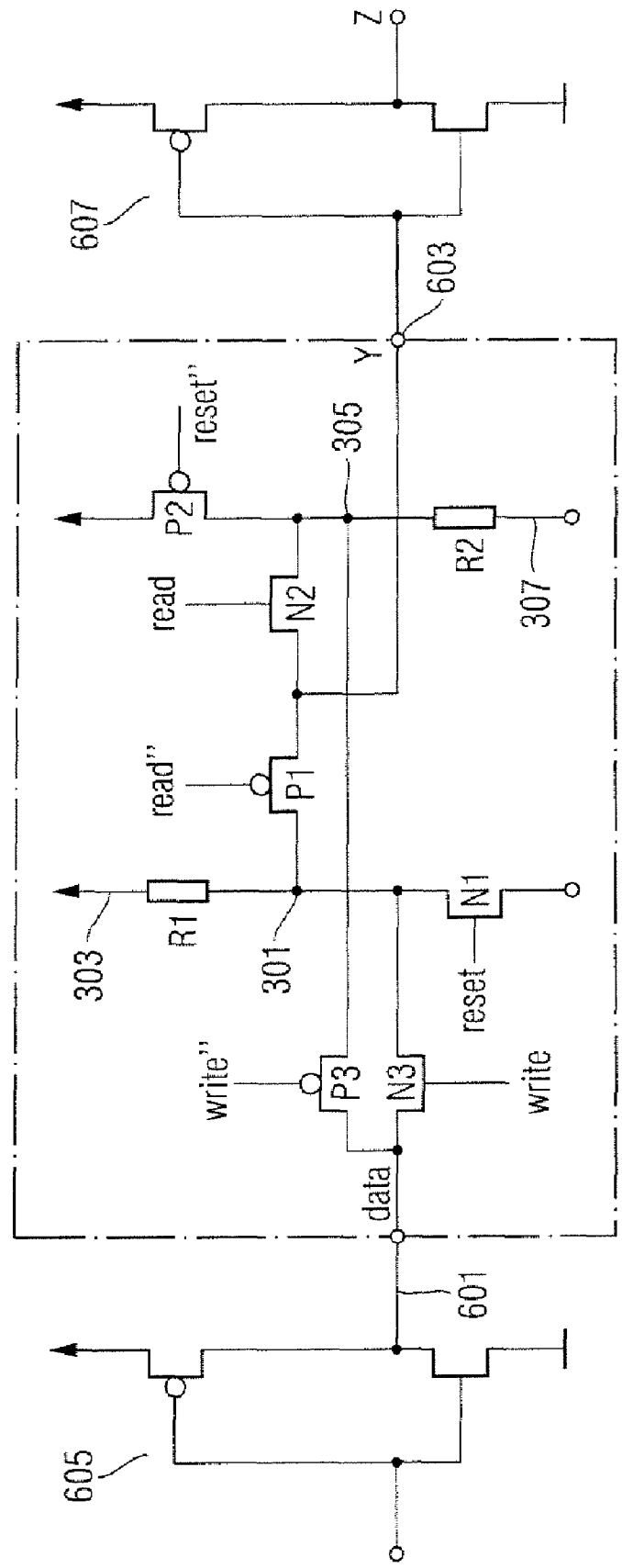
FIG. 6a shows a memory cell in accordance with one exemplary embodiment of the invention.

FIG. 6a shows an exemplary embodiment of a memory cell according to one embodiment of the invention.

The memory element comprises the resistance element R1, the further resistance element R2, a transistor N3, which may be an N-channel field effect transistor and which is coupled between an input 601 of the memory cell and the first terminal 301 of the resistance element R1. The memory element furthermore comprises a transistor N1 which may be an N-channel field effect transistor and which is connected between the first terminal 301 of the resistance element R1 and a potential node, to which a potential can be applied.

The memory element furthermore comprises a transistor P3, which may be a P-channel field effect transistor and which is connected between the input 601 of the memory cell and the first terminal 305 of the resistance element R2. The memory element furthermore comprises a transistor P2 which may be a P-channel field effect transistor connected between the first terminal 305 of the resistance element R2 and a potential node, to which the supply potential can be applied, by way of example. The current generating device comprises the transistors N1, N3, P2 and P3.

The memory read-out element comprises a transistor P1, which may be a P-channel field effect transistor and a transistor N2, which may be an N-channel field effect transistor. The transistors P1 and N2 are connected to one another via a node and produce a circuit which is connected between the first terminal 301 of the resistance element R1 and the first terminal 305 of the resistance element R2. The node between the transistors P1 and N2 is connected to an output terminal 603 of the memory cell.

The memory cell furthermore comprises an input driver 605 and an output driver 607. The input driver 605 and the output driver 607 are constructed identically and comprise, as in the exemplary embodiment illustrated in FIG. 6a, two field effect transistors of different types, which are connected to one another by the control terminals (gate). Instead of the inverter, however, it is also possible for a NAND gate to be provided.

The driver 605 is provided in order to receive a signal characterized by a voltage level for example, and in order to stabilize this signal, so that a signal (data) having a stable voltage level is present at the terminal 601 of the memory cell.

In accordance with one embodiment, the driver 605 is designed to make available in a manner as far as possible uncorrupted, that current which is generated by the current generating device.

The output driver 607 is provided in order to stabilize the signal present at the terminal 603 of the memory cell and in order to output a stable signal via an output Z.

In one embodiment, the current generating device is designed to receive control signals (write" and write), which may be complementary to one another, in order to convert either the resistance element R1 or the further resistance element R2 for example from the first, amorphous state into the second, crystalline state. When a supply potential is present at the second terminal 303 of the resistance element R1 and a reference potential, for example the earth potential, is present at the second terminal 307 of the further resistance element R2, upon activation of the transistor N3, the resistance element R1 is converted into the second state only when the reference potential, for example, which may represent an amplitude (level) of a signal (data), is present at the terminal 601 and when the current with the second amplitude is generated through R1. If, by contrast, the supply potential, which may represent a second amplitude value of the signal, is present at the terminal 601, then no current flows through R1 so that a state change is not engendered. The positive potential is thereby transferred through the transistor P3 to the terminal 305, so that R2 can be converted into the second state if the current with the second amplitude is generated through R2. In order to convert the resistance elements R1 and R2 into the amorphous state (resetting), control signals reset and reset" are applied to the control terminals of the transistors N1 and P2.

In accordance with one embodiment, the initial state of the resistance elements R1 and R2 is the first state (high-resistance state).

In general, the current generating device may be designed to receive a signal (data) that can be applied to the input 601 of the memory cell, and to generate a current with the second amplitude only through R1 if the signal has a first signal level, for example the reference potential, and to generate the current with the second amplitude only through R2 if the signal has a second level, for example supply potential. The transistors P3 and N3 may in this case be simultaneously activated.

Figure 6B:
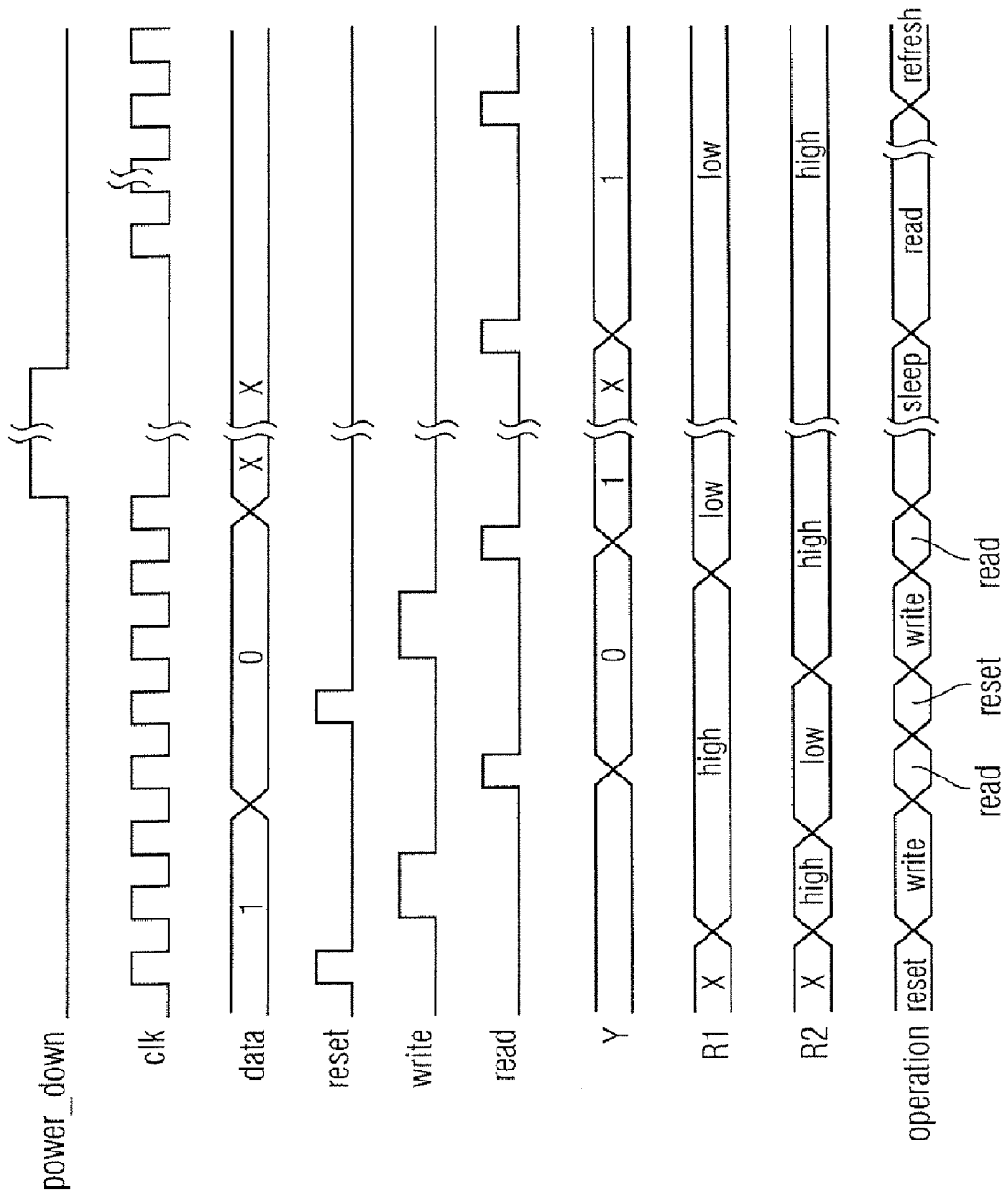
FIG. 6b shows signal diagrams for the memory cell from FIG. 6a in accordance with one exemplary embodiment.

FIG. 6b shows a signal and state diagram associated with operation of the memory cell.

During the read-out operation, the "write" and "reset" signals may have a low level, it being possible for the "read" signal to be pulsed. Assuming that the resistance elements R1 and R2 are in a complementary state (e.g. R1 high resistance, R2 low resistance) during a high level of the "read" signal, at the node Y either a low or a high voltage level may be generated which approximates to a voltage level of 0.01 V, by way of example, given a supply voltage of 1 V for a resistance value of 1 MΩ for R1 and a resistance value of 10 kΩ for R2.

If the "read" signal has a low level, then the previous value may be stored in a capacitance of an output gate (e.g. inverter). In the case of typical 130 nm CMOS elements having regular threshold voltages Vth ($C_{input}$=4fF, $V_{dd}$=1V, $I_{off}$<0.2 nA) the stored voltage level may decrease only to 75% over at least 5 μs. At an operating frequency of 100 MHz it may be useful to carry out a refresh in every 500th cycle.

In one embodiment, before the resistance elements are programmed in complementary fashion, they may be reset by the generation of a short pulse of the "reset" signal, which triggers a high reset current through R1 and R2 and which causes R1 and R2 to undergo transition into the amorphous state, in which they have high resistance. The high current may be provided e.g. by means of a large W/L ratio of the transistors N1 and P2. A subsequent long pulse of the "write" signal constrains a lower set current through one of the two resistance elements in a manner dependent on "data" (if "data" is high, by way of example, then a set current flows through R2 and no current flows through R1). The lower current may be ensured, e.g., by means of a lower W/L ratio of the transistors N3 and P3.

After the supply voltage has been switched off and the supply voltage has subsequently been switched on, a simple "read" pulse may be used to output the stored value at the output of the cell.

If a refresh of an output driver is not expedient, hold circuits may be used to match the value to be read out at the output of the memory cell. Furthermore, a feedback from Z to Y, via e.g. an inverter, may be provided.

Figure 7:
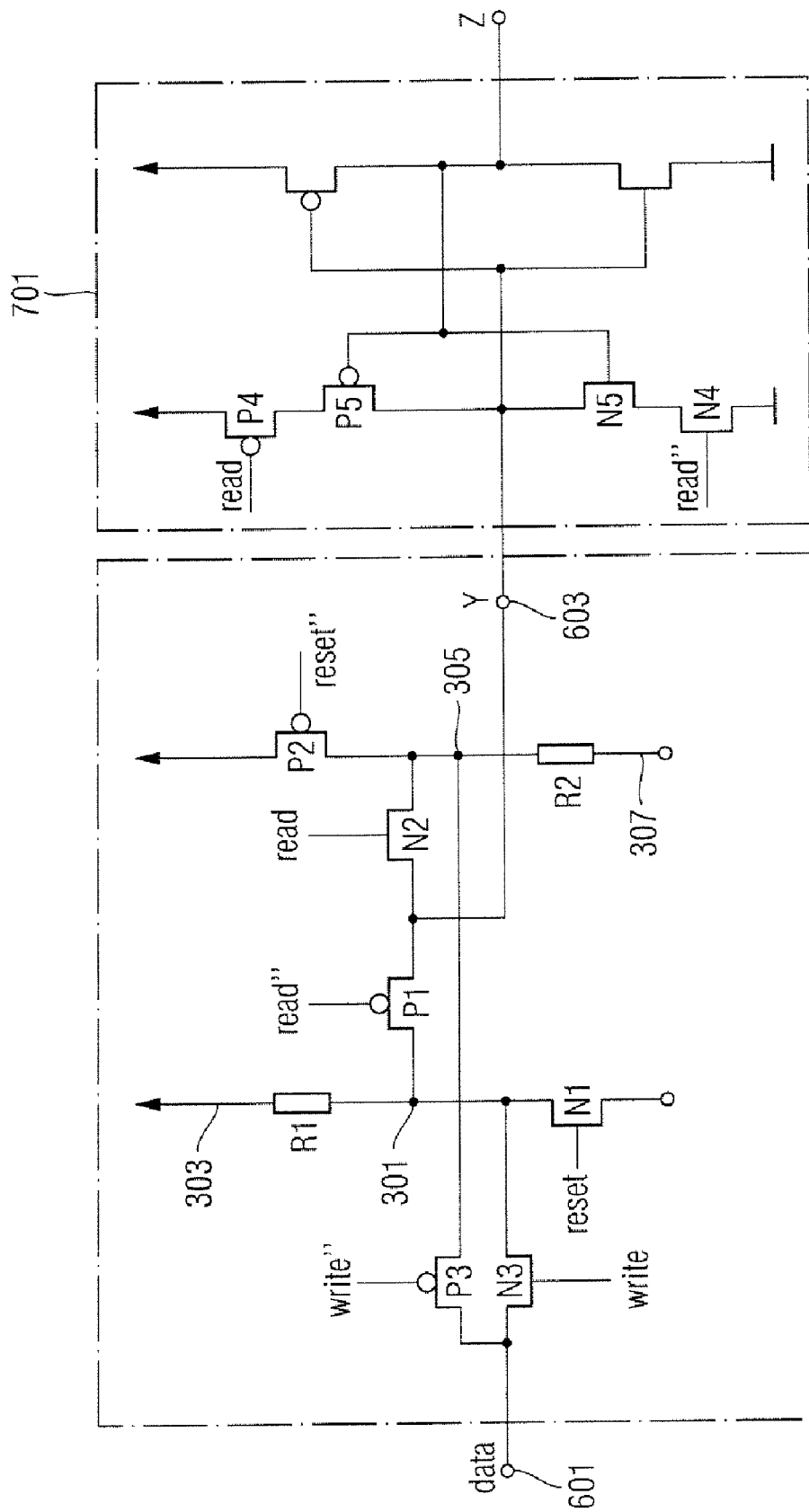
FIG. 7 shows a memory cell in accordance with a further exemplary embodiment of the invention.

FIG. 7 shows a memory cell in accordance with a further exemplary embodiment of the invention. In contrast to the exemplary embodiment illustrated in FIG. 6a, the memory cell comprises a latch register 701 (latched output), the input of which is connected to the output terminal 603 of the (core) memory cell (the core memory cell comprises the elements enclosed by a border).

The latch register 701 comprises N-channel field effect transistors N4, N5 and P-channel field effect transistors P4 and P5, which are connected up in the manner illustrated in FIG. 7. The latch register 701 furthermore comprises an N-channel field effect transistor and a P-channel field effect transistor connected downstream of the circuit comprising the transistors N4, N5, P4 and P5.

The functioning of the memory cell illustrated in FIG. 7 is similar to the functioning of the pulsed memory cell from FIG. 6a with the exception of the read-out operation. During the read-out operation, the feedback circuit P4, P5, N5 and N4 is switched off by means of P4 and N4, while P1 and N2 are in the on state and drive the stored value towards the output nodes Y and Z. After the read-out pulse has ended, the feedback circuit may function as a hold element and convert the output value into a stable value.

The basic circuit structures according to embodiments of the invention for writing to and reading from the PCM elements can be used in all types of circuits which use programming of the PCM elements or detection of the resistance values thereof. The non-volatile memory cell structure according to one embodiment of the invention is one example of a circuit which equalizes the advantages of the substructures according to one embodiment of the invention (e.g. the memory elements and the memory read-out elements).

Possible applications of the non-volatile memory cell according to embodiments of the invention might lie, for example, in the area of configurable logic circuits (e.g., FPGAs) where distributed configuration memory cells are used for controlling switches, in order to produce suitable connections, and for implementing look-up tables.

Figure 8A:
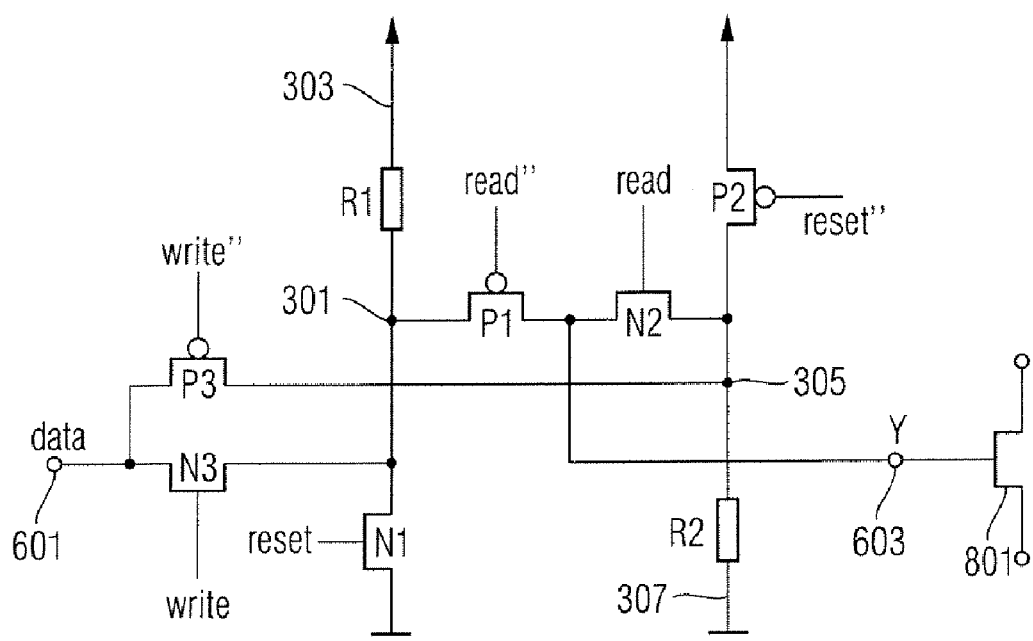
FIG. 8a shows a memory cell in accordance with a further exemplary embodiment of the invention.

FIG. 8a shows a memory cell in accordance with a further exemplary embodiment. In contrast to the memory cell illustrated in FIG. 7, the memory cell comprises a switch 801, which may be a transistor, for example, the control terminal of which is connected to the output terminal 603 of the memory cell, the reference potential being the earth potential.

Figure 8B:
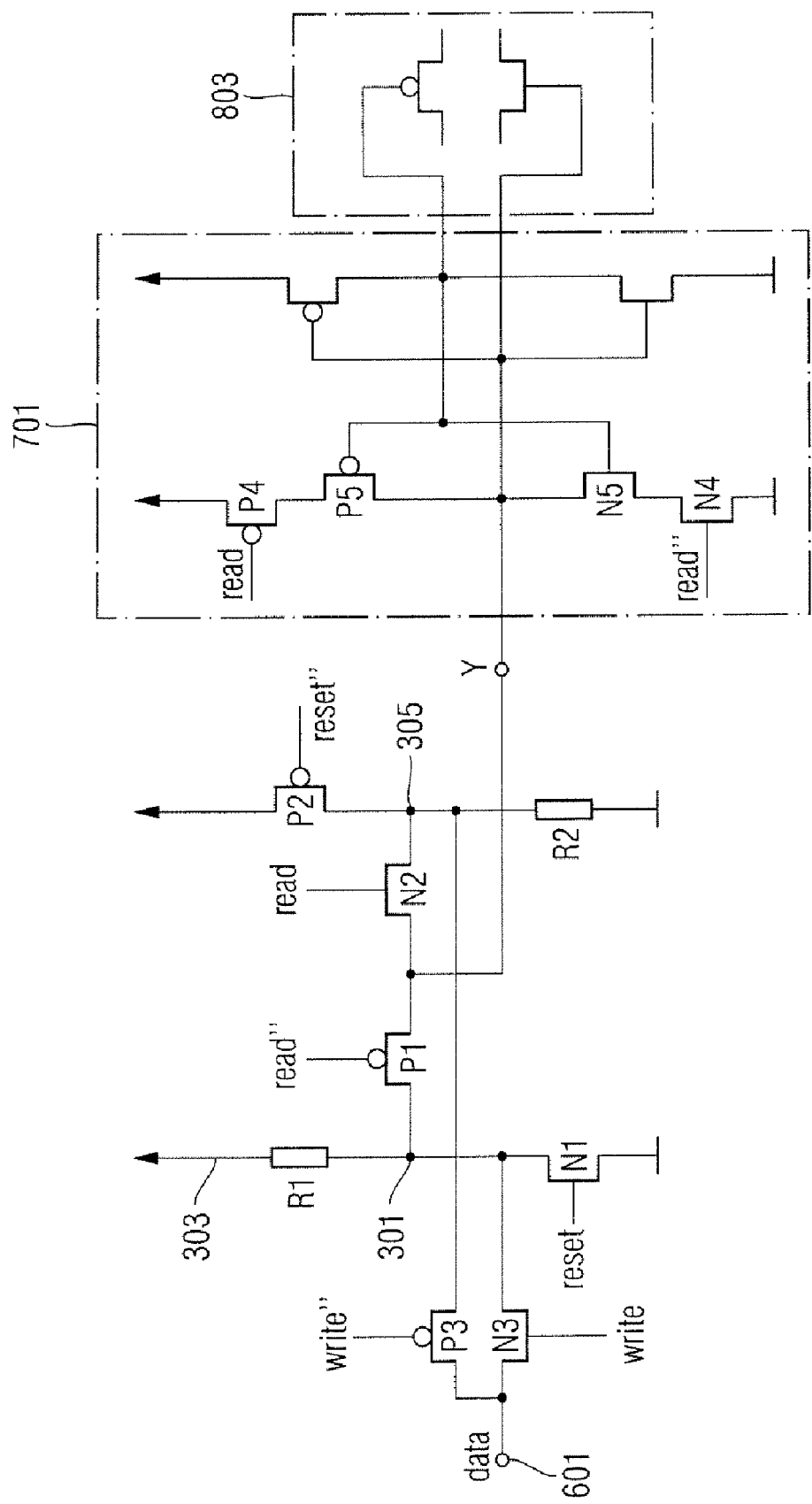
FIG. 8b shows a memory cell in accordance with a further exemplary embodiment of the invention.
Figure 9A:
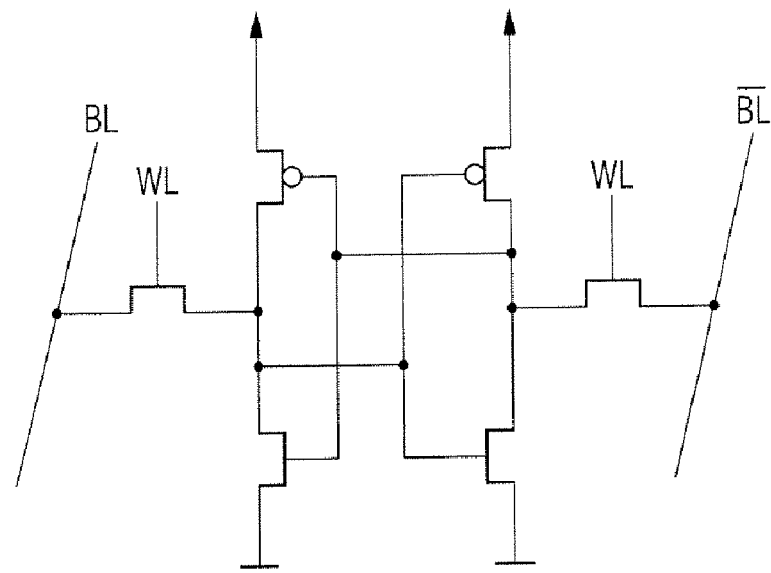
FIG. 9a shows an SRAM cell.
Figure 9B:
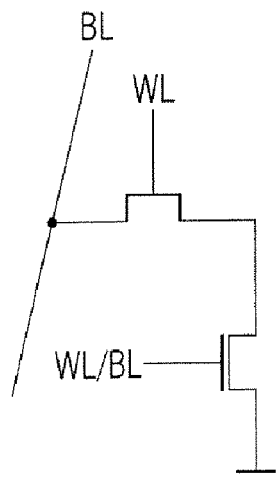
FIG. 9b shows a flash cell.
Figure 9C:
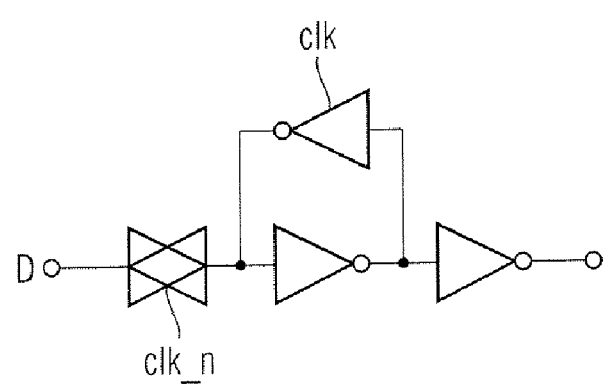
FIG. 9c shows a latch cell.
Figure 10:
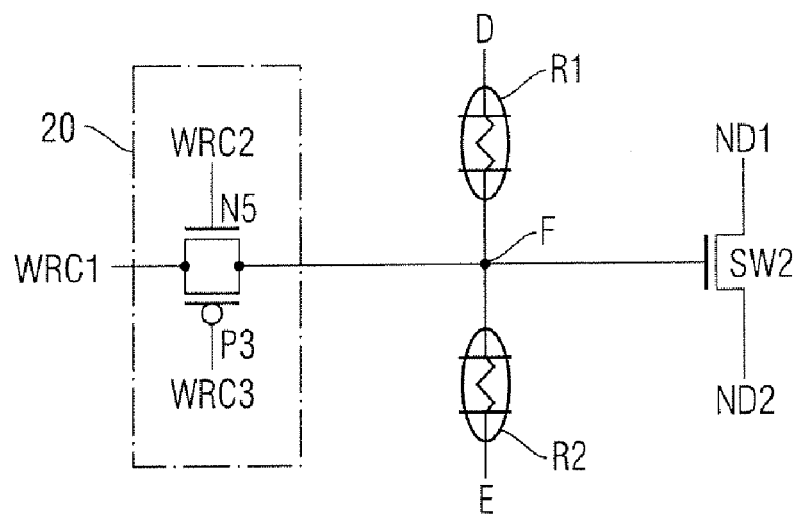
FIG. 10 shows a non-volatile memory cell.
Figure 11A:
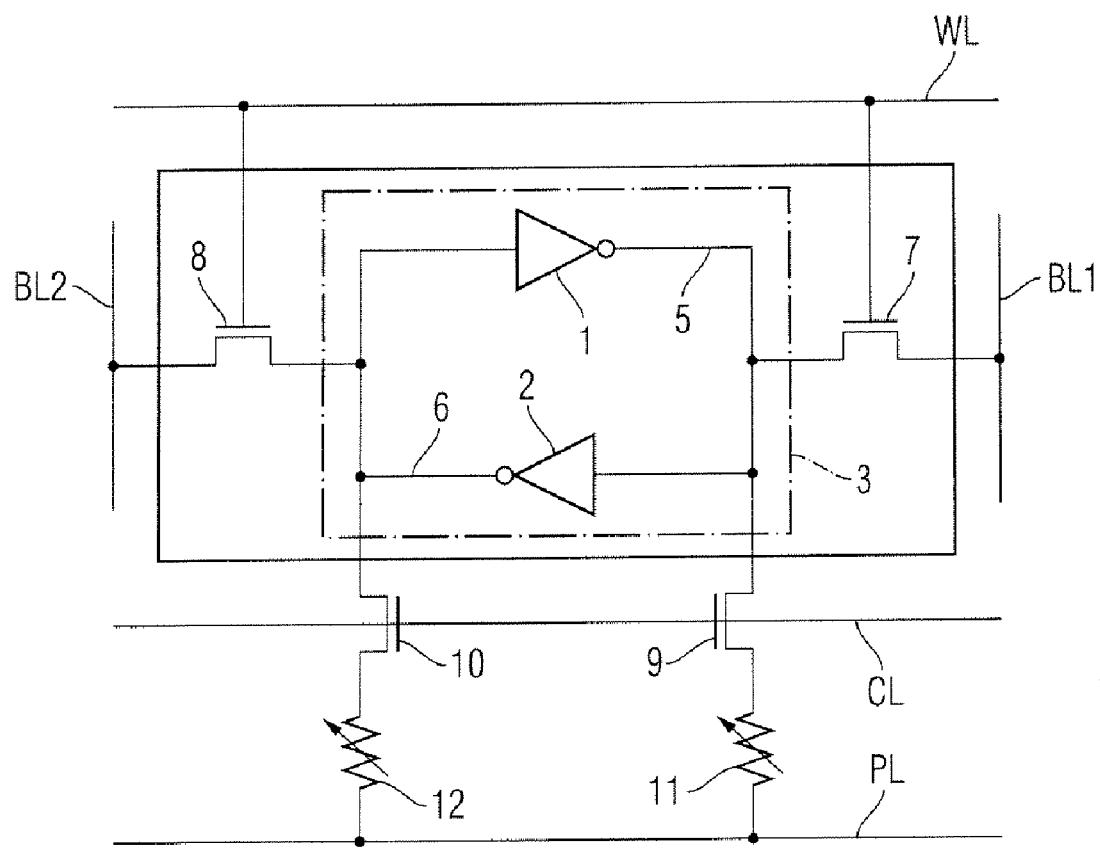
FIG. 11a shows a non-volatile memory cell.
Figure 11B:
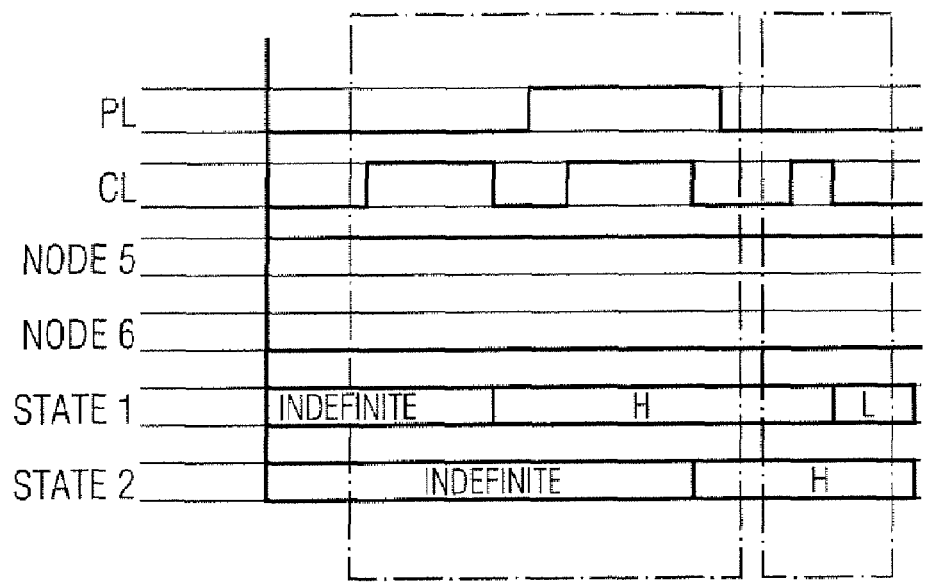
Figure 11C:
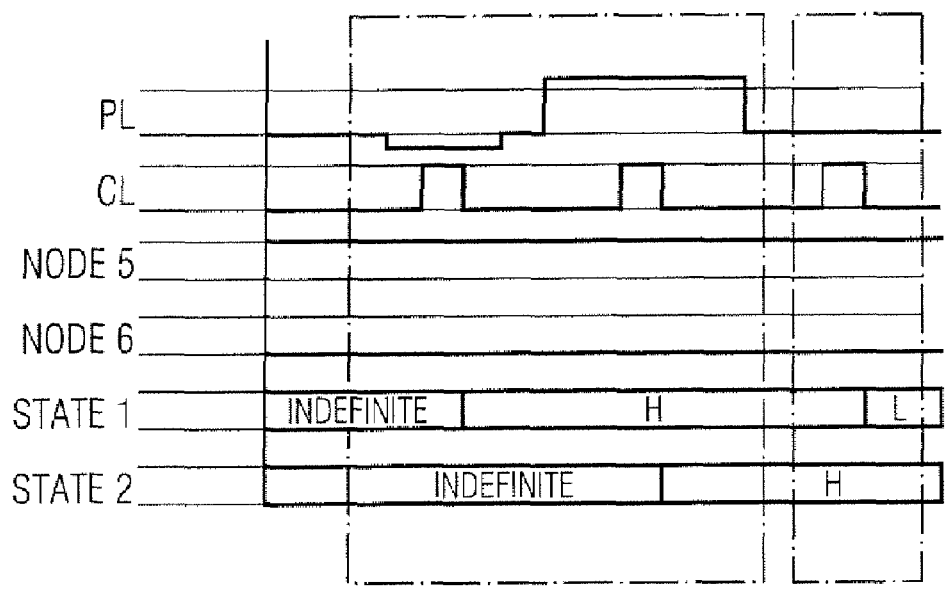
Figure 11D:
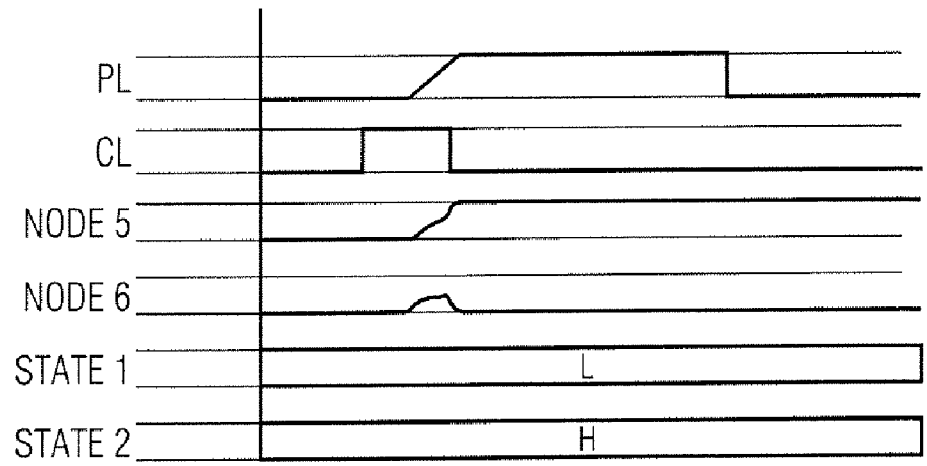
Figure 12A:
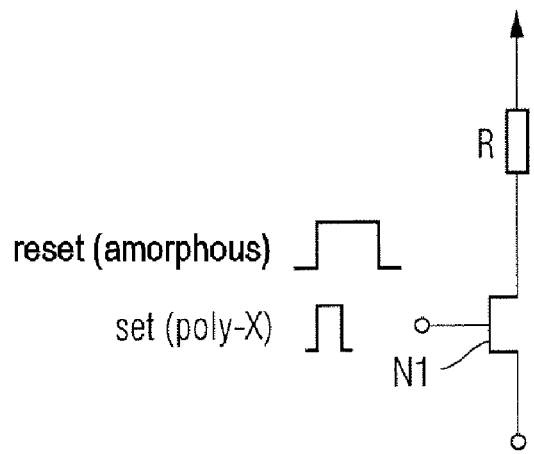
FIGS. 12a-12b show the programming of PCM elements.
Figure 12B:
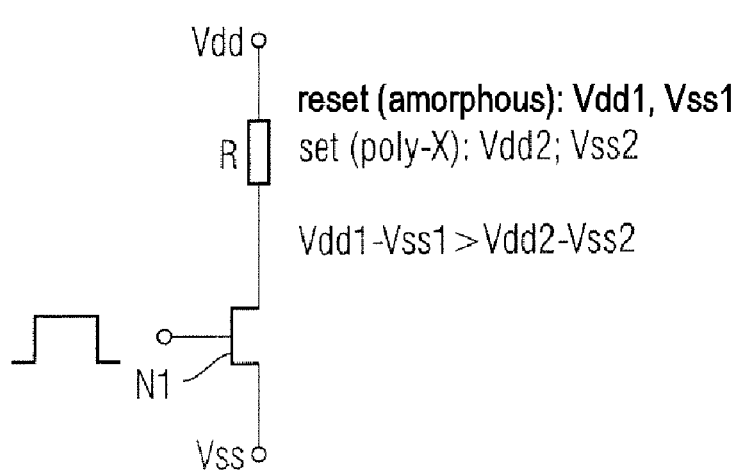

FIG. 8b shows a memory cell in accordance with a further exemplary embodiment of the present invention. In contrast to the exemplary embodiment illustrated in FIG. 7, the memory cell illustrated in FIG. 8b additionally comprises an output gate 803 which may be a transmission gate. The output gate 803 may include an N-channel field effect transistor and a P-channel field effect transistor and is connected to the memory cell, as illustrated in FIG. 8b. The output gate 803 serves for transmitting both a low voltage level, for example 0V, and a high voltage level, for example 3V, to an output in an uncorrupted manner.

The memory cell according to one embodiment of the invention may be advantageous, compared with an SRAM cell, on account of its non-volatile character and the resistance to errors. Compared with a flash cell, the memory cell according to one embodiment of the invention may use a single supply voltage. Furthermore, the process technology on which the memory cell is based can be adapted in a simple manner to the latest logic processes in which the PCM cell can be implemented, for example in a metal layer (BEOL). In comparison with known PCM cells, the memory cell according to one embodiment of the invention may prevent a destructive read-out, by way of example. The leakage current losses may also reduced. Furthermore, the resistance elements may be enabled to be programmed by means of a variable current amplitude and/or pulse width, for example, without a second supply voltage.

The memory read-out element according to one embodiment of the invention, which is illustrated for example in FIGS. 5a to 5c and which can be used by the memory cell, contributes to a loss reduction by means of a reduction of a constant current flow through the resistance elements R1 and R2, because a resistance of a transistor in the switched-off state may be in the GΩ range, while a resistance of a PCM element may be in the MΩ range.

According to one embodiment of the invention, a single voltage may be used for reading from and writing to the resistance elements. In accordance with a further exemplary embodiment, the memory read-out element may be designed to generate a control signal which has a form of a short read-out pulse, for example 5 ns, and which activates the pass transistors P1 and N2 for reading out the memory state.

In one embodiment, a destructive read-out may be prevented because a short read-out pulse, within R1 and R2, does not enable evolution of heat that might bring about an undesirable phase change. Such a circuit permits an identical supply voltage to be used for reading from and for writing to the PCM elements. Furthermore, the choice of the pass transistors (N or, respectively, P type) P1 and N2 may provide a potential difference which is reduced by the threshold voltage and is dropped across the resistance elements during read-out. By contrast, during writing the full potential difference may be dropped across the resistance elements to be programmed by virtue of the choice of the type of pass transistors (N or respectively P type) P3 and N3.

In one embodiment, the resistance elements are may be PCM elements. However, other elements may be provided which are able to permanently assume different resistance values. One advantage of PCM technology may be that in some cases scaling may not be disadvantageous, but rather may be advantageous. The smaller the structures become, the smaller the currents used to bring about a phase change. Furthermore, the phase change elements may be realized by means of sublithographic techniques in the upper layers of a CMOS process and can therefore be stacked over the transistors, e.g., over the transistors which may be used to form the memory cell. PCM elements furthermore may provide a good operating temperature stability. Furthermore PCM elements may provide a good characteristic with regard to maintaining the properties (maintenance for more than 10 years at 110° C.). One embodiment of the invention may use elements whose resistance value can be changed in such a way that it is retained even in the absence of a supply voltage (non-volatility).

One embodiment of the invention may provide basic circuits which interact with resistance elements. Two programmable resistance elements may be used, by way of example, which are arranged in a complementary manner. However, the principles, according to one embodiment of the invention can also be applied to arrangements with individual resistance elements. The set and reset operations may be carried out in such a way that it is possible to vary not only a pulse length of the programming current but also the amplitude thereof, as illustrated, for example in FIGS. 3a and 3b.

The resistance value of the PCM elements can be evaluated without a change in the PCM elements, that is to say that a read-out operation is carried out at the same supply voltage as the write operation (storage operation) and with minimal leakage current losses, as illustrated for example in FIG. 5b. The exemplary embodiment in FIG. 6a illustrates the data storage in non-volatile memory cells which utilizes the advantages according to one embodiment of the invention.

Depending on the conditions, the methods according to embodiments of the invention can be implemented in hardware or in software. The implementation may be effected on a digital storage medium, for example a floppy disk or CD with control signals which can be read out electronically and which can interact with a programmable computer system in such a way that the corresponding method is executed. One embodiment of the invention thus generally also provide a computer program product with program code stored on a machine-readable carrier and serving to carry out the methods according to embodiments of the invention if the computer program product runs on a computer. Embodiments of the invention can thus be realized as a computer program having a program code for carrying out at least one of the embodiments of the invention if the computer program runs on a computer.

While the foregoing is directed to embodiments of the present invention, other and further embodiments of the invention may be devised without departing from the basic scope thereof, and the scope thereof is determined by the claims that follow.

What is claimed is:

1. A memory element comprising:
  a resistance element having a first resistance value in a first state and a second resistance value in a second state, wherein the resistance element is configured to be placed in one of the second state and the first state, and wherein the first resistance value and the second resistance value are different;
  a current generating device coupled to one of a first terminal and a second terminal of the resistance element, wherein the current generating device is configured to:
    generate a current with a first amplitude through the resistance element when a predetermined potential is present at a second terminal of the resistance element, wherein the current with the first amplitude is configured to place the resistance element into the first state with the first resistance value; and
    generate a current with a second amplitude through the resistance element when the predetermined potential is present at the second terminal of the resistance element, wherein the current with the second amplitude is configured to place the resistance element into the second state with the second resistance value, wherein the first resistance value represents a first memory state and the second resistance value represents a second memory state.

2. The memory element of claim 1, wherein the current generating device is configured to apply the predetermined potential to the second terminal of the resistance element.

3. The memory element of claim 1, wherein the predetermined potential is one of a supply potential and a reference potential.

4. The memory element of claim 1, wherein the resistance element is a phase change memory element.

5. The memory element of claim 1, wherein the current generating device comprises a transistor for generating the current through the resistance element, wherein a control signal is applied to a control terminal of the transistor and wherein an amplitude of the current through the resistance element is dependent on the control signal.

6. The memory element of claim 5, wherein the control terminal comprises one of a gate terminal and a bulk terminal.

7. The memory element of claim 5, wherein the transistor is configured to generate the current with the first amplitude if the control signal has a first value and generate the current with the second amplitude if the control signal has a second value.

8. The memory element of claim 1, wherein the current generating device comprises:
  a first transistor for generating the current with the first amplitude; and
  a second transistor for generating the current with the second amplitude.

9. The memory element of claim 8, wherein a first terminal of the first transistor is coupled to a first terminal of the second transistor, and wherein the first terminal of the first transistor and the first terminal of the second transistor are coupled to the resistance element, and wherein a reference potential is applied to a second terminal of the first transistor and to a second terminal of the second transistor.

10. The memory element of claim 8, wherein the first transistor and the second transistor are field effect transistors and wherein a gate width of the first transistor is less than a gate width of the second transistor.

11. The memory element of claim 8, wherein the first transistor and the second transistor are field effect transistors and wherein a threshold voltage of the second transistor is less than a threshold voltage of the first transistor.

12. The memory element of claim 1, wherein the current generating device is configured to generate the current with the first amplitude for a first time duration, and to generate the current with the second amplitude for a second time duration, wherein the second time duration is less or equal to the first time duration.

13. The memory element of claim 1, wherein the current generating device is configured to
  in response to receiving a first control signal, generate the current with the first amplitude; and in response to receiving a second control signal, generate the current with the second amplitude.

14. The memory element of claim 13, further comprising a control element designed to generate the first control signal and to generate the second control signal.

15. The memory element of claim 1, wherein the current generating device is configured to generate the current with the second amplitude through the resistance element, thereby converting the resistance element from the first state into the second state.

16. The memory element of claim 1, further comprising a second resistance element having a first resistance value in the first state and a second resistance value in the second state, wherein:
   the current generating device is coupled to a first terminal of the further resistance element; and
   wherein the current generating device is configured to:
      generate a current with the first amplitude through the further resistance element when the predetermined potential is present at a second terminal of the second resistance element, thereby placing the second resistance element into the first state; and
      generate a current with the second amplitude through the second resistance element when the predetermined potential is present at the second terminal, thereby placing the second resistance element into the second state.

17. A memory read-out element for reading out a memory state of a memory element, comprising:
   a first resistance element having a first resistance value and a second resistance element having a second resistance value, wherein a ratio of the first resistance of the first resistance element and the second resistance value of the second resistance element represents a memory state; and
   a potential reduction device configured to:
      reduce a potential at the first resistance element during a read-out of the memory element if the first resistance value is greater than the second resistance value; and
      reduce a potential at the second resistance element during the read-out of the memory element if the second resistance value is greater than the first resistance value.

18. The memory read-out element of claim 17, wherein the first resistance element and the second resistance element are phase change memory elements whose state represents the memory state, and wherein the potential reduction device is configured to:
   reduce a voltage across the first resistance element, thereby preventing a change in the state of the resistance element when reading out a state of the first resistance element; and
   reduce a voltage across the second resistance element, thereby preventing a change in the state of the second resistance element when reading a state of the second resistance element.

19. The memory read-out element of claim 17, further comprising circuitry configured to:
   while reading the memory state, apply a first potential to a first terminal of the first resistance element and apply a second potential to a first terminal of the second resistance element, wherein the first potential and the second potential are different.

20. The memory read-out element of claim 17, wherein the potential reduction device further comprises:
   a first switch coupled to the first resistance element, wherein the first switch and the first resistance element form a first arrangement; and
   a second switch coupled to the second resistance element, wherein the second switch and the second resistance element form a second arrangement, wherein the first arrangement is coupled to the second arrangement via a node and wherein the memory read-out element is configured to activate the first switch and the second switch simultaneously while reading out the memory state, thereby generating a potential representing the memory state at the node.

21. The memory read-out element of claim 20, wherein the first switch is configured to generate a voltage drop across the first switch if a first resistance value of the first resistance element is greater than a second resistance value of the second resistance element, thereby reducing a voltage across the first resistance element, and wherein the second switch is configured to generate a voltage drop across the second switch which is greater than the voltage drop across the first switch if the second resistance value is greater than the first resistance value, thereby reducing a voltage across the second resistance element.

22. The memory read-out element of claim 20, further comprising:
   a series circuit comprising the first arrangement and the second arrangement coupled at the node, wherein, during a read operation, a read voltage applied to the first and the second arrangement produce an output voltage corresponding to the memory state at the node.

23. The memory read-out element of claim 22, wherein the first switch is a P-channel field effect transistor and the second switch is an N-channel field effect transistor.

24. The memory read-out element of claim 22, wherein the first switch is an N-channel field effect transistor and the second switch is a P-channel field effect transistor.

25. The memory read-out element of claim 20, further comprising a capacitance element, wherein a first terminal of the capacitance element is connected to the node and wherein a second terminal of the capacitance element is coupled to a potential, and wherein the capacitance element is configured to receive a quantity of charge which represents the memory state.

26. The memory read-out element of claim 25, further comprising circuitry configured to:
   deactivate the first switch and the second switch after charging the capacitance element; and
   activate the first switch and the second switch in a pulsed manner, thereby maintaining the quantity of charge which represents the memory state.

27. The memory read-out element of claim 25, wherein the current generating device is configured to:
   receive one of a first and a second control signal;
   in response to receiving the first control signal, generate a current with the first amplitude through the resistance element; and
   in response to receiving the second control signal, generate a current with the second amplitude through the resistance element.

28. The memory read-out element of claim 25, wherein the current generating device comprises:
   a first transistor for generating the current with the first amplitude through the resistance element;
   a second transistor for generating the current with the second amplitude through the resistance element;
   a third transistor for generating the current with the first amplitude through the further resistance element; and a fourth transistor for generating the current with the second amplitude through the further resistance element.

29. The memory read-out element of claim 28, wherein the first and second transistors are N-channel field effect transistors and the third and fourth transistors are P-channel field effect transistors.

30. The memory read-out element of claim 28, wherein the first and second transistors are P-channel field effect transistors and the third and fourth transistors are N-channel field effect transistors.

31. The memory read-out element of claim 28, wherein the circuitry is further configured to generate the control signals for controlling the current generating device.

32. A method for converting a memory element into a first memory state or into a second memory state, comprising:

providing the memory element, wherein the memory element comprises a first resistance element having a first resistance value in a first state and a second resistance value in a second state, wherein the resistance element is configured to be placed in one of the first state and the second state, the first resistance value and the second resistance value being different, and wherein the resistance element comprises a first and a second terminal;

generating a current with a first amplitude through the resistance element when a predetermined potential is present at the second terminal of the resistance element, thereby placing the resistance element into the first state having the first resistance value; and generating a current with the second amplitude through the resistance element when the predetermined potential is present at the second terminal of the resistance element, thereby placing the resistance element into the second state having the second resistance value, wherein the first resistance value represents a first memory state and the second resistance value represents a second memory state, and wherein the current through the resistance element being is applied at the first terminal.

33. A method for reading out a memory state of a memory element, comprising:

providing the memory element, wherein the memory element comprises a first resistance element and a second resistance element, wherein a ratio of the resistance values of the first resistance element and of the second resistance element represents the memory state;

during a read-out of the memory element, reducing a potential at the first resistance element if the first resistance value is greater than the second resistance value; and during the read-out, reducing a potential at the second resistance element if the second resistance value is greater than the first resistance value.

* * * * *